(12) United States Patent
Gao et al.

(10) Patent No.: US 12,124,785 B2
(45) Date of Patent: Oct. 22, 2024

(54) METHOD OF MAKING CELL REGIONS OF INTEGRATED CIRCUITS

(71) Applicant: TAIWAN SEMICONDUCTOR MANUFACTURING COMPANY, LTD., Hsinchu (TW)

(72) Inventors: Jia-Hong Gao, Hsinchu (TW); Hui-Zhong Zhuang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/448,115

(22) Filed: Aug. 10, 2023

(65) Prior Publication Data

US 2023/0409798 A1  Dec. 21, 2023

Related U.S. Application Data

(62) Division of application No. 17/405,626, filed on Aug. 18, 2021.

(51) Int. Cl.
*G06F 30/30* (2020.01)
*G06F 30/392* (2020.01)
*H01L 21/04* (2006.01)
*H01L 27/02* (2006.01)

(52) U.S. Cl.
CPC ........ *G06F 30/392* (2020.01); *H01L 21/041* (2013.01); *H01L 27/0207* (2013.01)

(58) Field of Classification Search
None
See application file for complete search history.

(56) References Cited

U.S. PATENT DOCUMENTS

| | | | |
|---|---|---|---|
| 7,260,442 B2 | 8/2007 | Hwang et al. | |
| 7,732,803 B2 * | 6/2010 | Shum | H01L 27/15 438/22 |
| 7,804,157 B2 * | 9/2010 | Sharma | H01L 29/0673 257/784 |
| 8,759,885 B1 | 6/2014 | Jain et al. | |
| 9,112,163 B2 * | 8/2015 | Uhrich | B82Y 10/00 |
| 9,256,709 B2 | 2/2016 | Yu et al. | |
| 10,224,331 B2 * | 3/2019 | Azmat | H01L 27/092 |
| 10,380,315 B2 | 8/2019 | Zhuang et al. | |
| 10,970,451 B2 | 4/2021 | Li et al. | |

(Continued)

FOREIGN PATENT DOCUMENTS

KR  20170023358  3/2017

*Primary Examiner* — Leigh M Garbowski
(74) *Attorney, Agent, or Firm* — Hauptman Ham, LLP

(57) ABSTRACT

A method of manufacturing an integrated circuit (IC) includes forming a first active region in a first cell. The method includes forming a plurality of second active regions in a second cell, wherein the second cell abuts the first cell. The method includes forming a third active region in a third cell, wherein the second cell is between the first cell and the third cell, and a height of the second cell is different from a height of the first cell or the third cell. The method includes forming a plurality of gate structures extending across each of the first active region, the plurality of second active regions, and the third active region. The method includes removing a first portion of a first gate structure at an interface between the first cell and the second cell between the first active region and the plurality of second active regions.

20 Claims, 19 Drawing Sheets

(56) References Cited

U.S. PATENT DOCUMENTS

| | | |
|---|---|---|
| 11,239,228 B2 * | 2/2022 | Lin .................... H01L 27/0207 |
| 11,556,688 B2 | 1/2023 | Li et al. |
| 2014/0040838 A1 | 2/2014 | Liu et al. |
| 2015/0278429 A1 | 10/2015 | Chang |
| 2023/0378267 A1 * | 11/2023 | Yang .................. H01L 21/0337 |

* cited by examiner

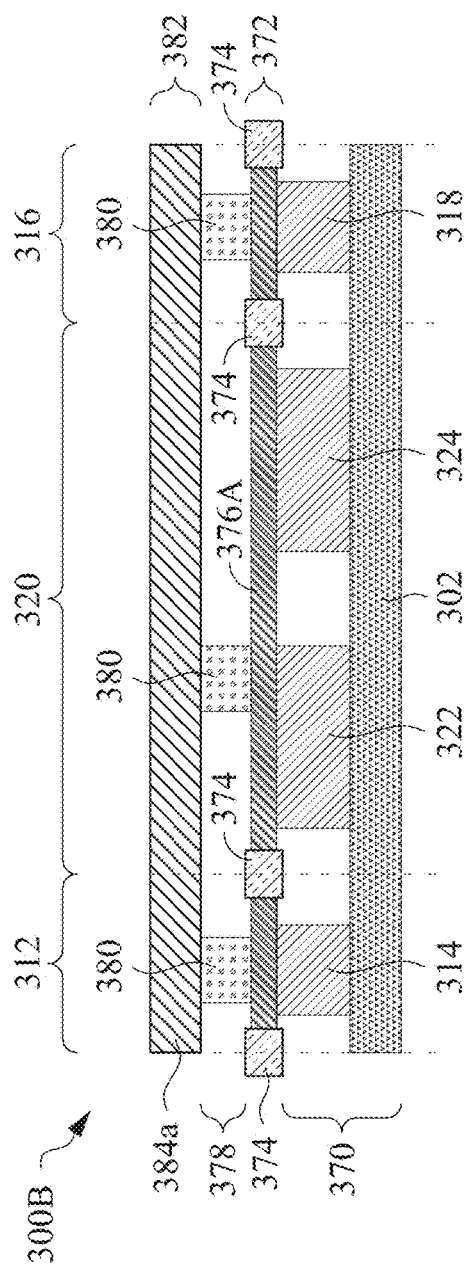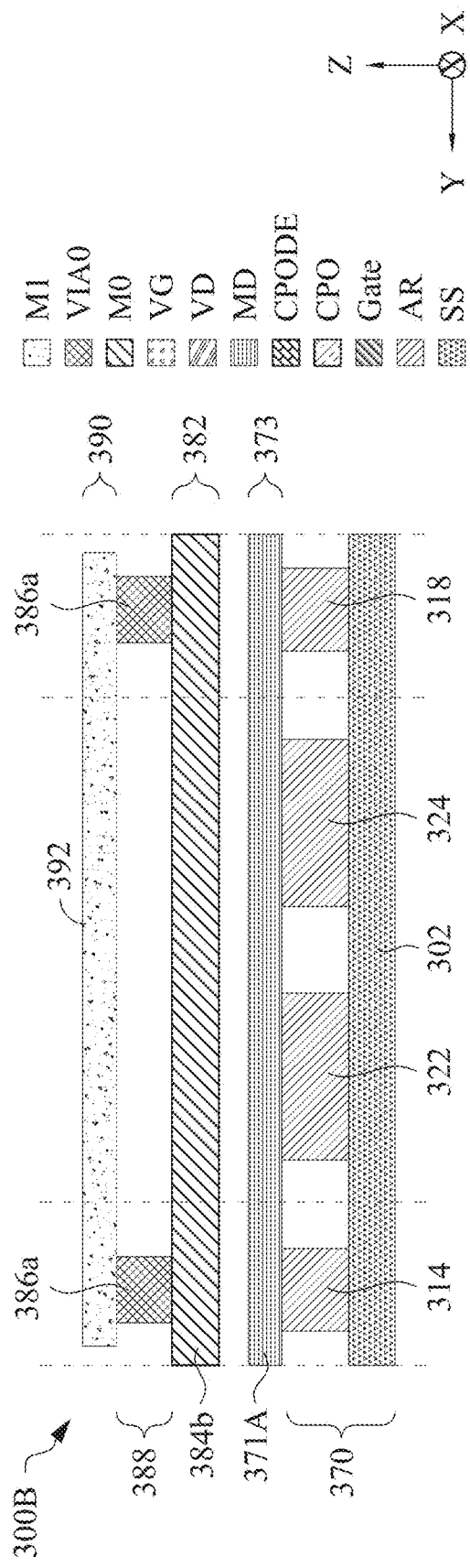

METHOD OF MAKING CELL REGIONS OF INTEGRATED CIRCUITS

PRIORITY CLAIM

This application is a divisional of U.S. application Ser. No. 17/405,626, filed Aug. 18, 2021, the entire contents of which are hereby incorporated by reference.

BACKGROUND

The semiconductor integrated circuit (IC) industry produces a wide variety of analog and digital devices to address issues in a number of different areas. Developments in semiconductor process technology nodes have progressively reduced component sizes and tightened spacing resulting in progressively increased transistor density. ICs have become smaller.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIG. 3C is a cross-sectional diagram of the layout diagram of FIG. 3B taken along line 3C-3C', in accordance with some embodiments.

FIG. 3D is a cross-sectional diagram of the layout diagram of FIG. 3B taken along line 3D-3D', in accordance with some embodiments.

DETAILED DESCRIPTION

Figure 1:
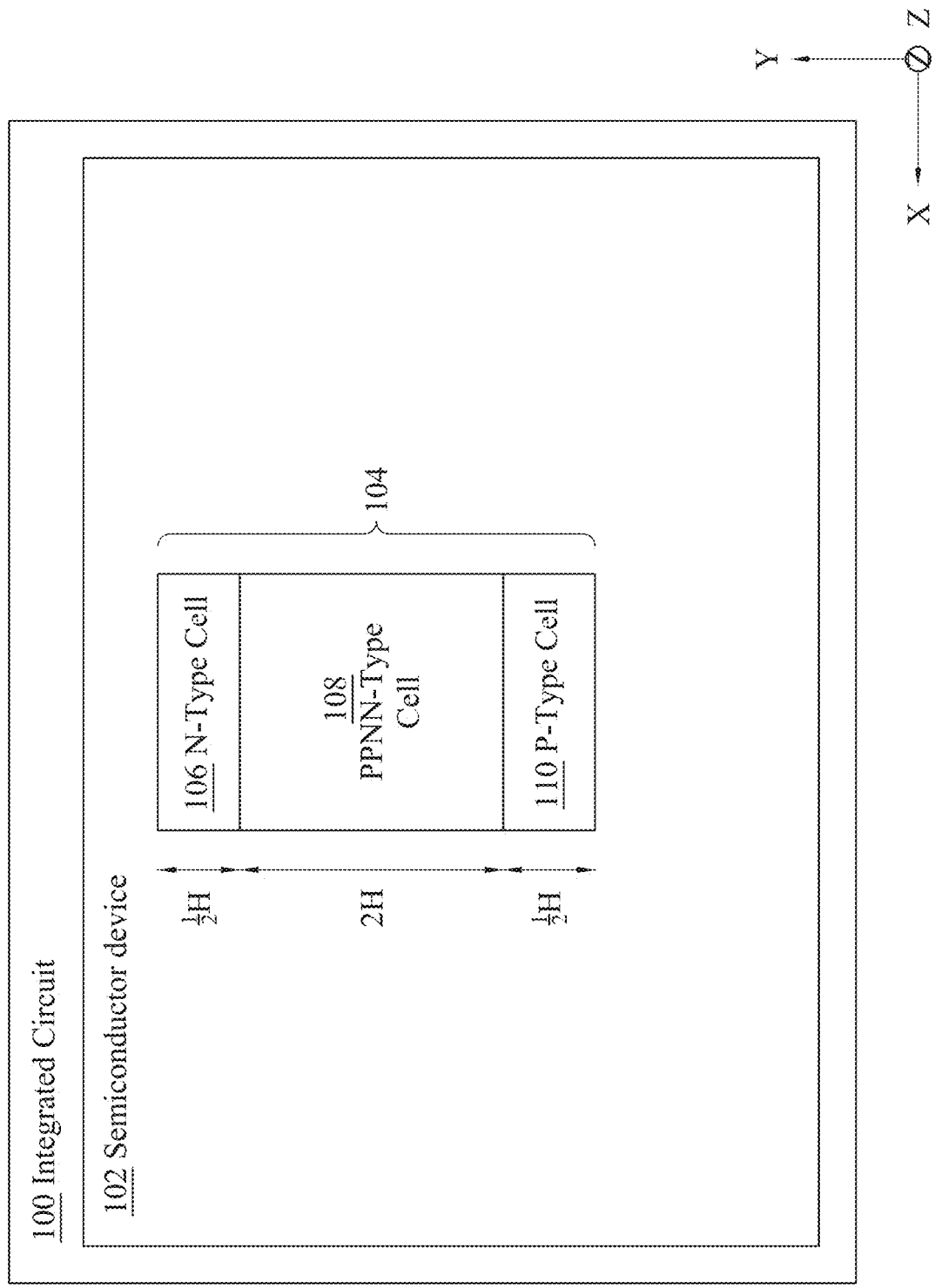
FIG. 1 is a block diagram of an integrated circuit (IC), in accordance with some embodiments.

The following disclosure discloses many different embodiments, or examples, for implementing different features of the subject matter. Specific examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may further include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In some embodiments, the term "standard cell structure" refers to a standardized building block included in a library of various standard cell structures. In some embodiments, various standard cell structures are selected from a library thereof and are used as components in a layout diagram representing a circuit.

In some embodiments, an integrated circuit (IC) includes first, second and third semiconductor cell regions. The first semiconductor cell region includes a first active region in a substrate extending in a first direction (e.g., parallel to the X-axis). In some embodiments, the first active region is configured with a first dopant type. The second cell region abuts the first cell region in a second direction (e.g., parallel to the Y-axis). The second semiconductor cell region includes second and third active regions in the substrate and extending in the first direction. In some embodiments, the second active region is configured with a second dopant type different from the first dopant type. In some embodiments, the third active region is configured with the first dopant type. The second active region is between first and third active regions. The third semiconductor cell region abuts the second semiconductor cell region in the second direction. The third semiconductor cell region includes a fourth active region in the substrate extending in the first direction. In some embodiments, the fourth active region is configured with the first dopant type. The third active region is between the fourth active region and the second active region. In some embodiments, the fourth active region is configured with the second dopant type. In some embodiments, the IC has an N-PPNN-P dopant-stack architecture.

According to another approach, the active regions of transistors in the other approach's counterpart of the second cell region of the given IC were extended in the first direction to accommodate the formation of transistors in the other approach's counterpart of the first and second cell regions of the given IC, with a result that the pitch in the first direction of the other approach's IC was greater than the pitch of the given IC. In some embodiments, by moving transistors correspondingly to the first and third cell regions, the pitch of the given IC is reduced as compared to the IC of the other approach, i.e., the footprint of the given IC is narrowed. Mindful that a width of a cell region is measured in multiples of a pitch unit δ, where δ is a unit of measure dependent on the corresponding semiconductor process technology node, in some embodiments, the given IC has a width reduced by 1δ, 2δ, 4δ, or the like, as compared to the IC of the other approach. In some embodiments, pitch unit δ, is referred to as contacted poly pitch (CPP). Typically, a larger/system IC uses many instances of the given IC so that the cumulative pitch-savings of 1δ, 2δ, 4δ, or the like, per given IC significantly contributes to a reduction in the overall footprint of the larger/system IC as compared to the other approach.

FIG. 1 is a block diagram of an IC 100, in accordance with some embodiments.

IC 100 includes a semiconductor device 102 with a circuit region 104. Circuit region 104 includes n-type cell region 106 and p-type cell region 110, each of which having a height of approximately ½H relative to a single height standard cell of height H in the direction of the Y-axis. Circuit region 104 further includes PPNN-type cell region 108 that has a height of approximately 2H. Relative to the Y-axis, PPNN-type cell region 108 is stacked on p-type cell region 110, and n-type cell region 106 is stacked on cell region 108.

IC 100 is further referred to as a chip, or a microchip, and is a set of electronic circuits on one small flat piece (e.g., chip or substrate) of semiconductor material, usually silicon or other suitable materials within the contemplated scope of the disclosure. IC 100 supports one or more metal oxide semiconductor field-effect transistors (MOSFETs) integrated into a chip; however, other suitable transistors and electrical components are within the contemplated scope of the disclosure. IC 100 is electrically coupled to, incorporates or houses one or more semiconductor device 102.

Semiconductor device 102 is an electronic component configured to use the electronic properties of a semiconductor material (e.g., primarily silicon, germanium, and gallium arsenide, as well as organic semiconductors and other suitable materials within the contemplated scope of the disclosure) for its function.

Circuit region 104 is configured for an N-PPNN-P dopant-stack architecture. For example, n-type cell region 106 abuts PPNN-type cell region 108, and PPNN-type cell region 108 abuts p-type cell region 110. In some embodiments, circuit region 104 abuts another cell, such as a standard cell region corresponding to a standard cell having a height of 1H (e.g., cell region 226 (FIG. 2)). In some embodiments, circuit region 104 abuts other cells with reduced or minimal spacing. In some embodiments, circuit region 104 is configured for a P-NNPP-N dopant-stack architecture; other suitable configurations are within the contemplated scope of the disclosure.

An N-PPNN-P dopant-stack architecture such as circuit region 104 reduces empty space between cell arrangements. N-type cell region 106 and p-type cell region 110 of circuit region 104 occupy space that typically would be empty according to other approaches. Thus, in some embodiments, a standard cell is narrowed relative to the X-axis by relocating transistors formerly in the now-narrowed area to otherwise empty space above and below the standard cell relative to the Y-axis. Narrowing the standard cell in width (relative to the X-axis) in such a manner also increases a height (relative to the Y-axis) of the standard cell. Because the relocated transistors are moved to formerly empty space; however, the consequential increase in height of the standard cell has little if any disadvantage.

Figure 2:
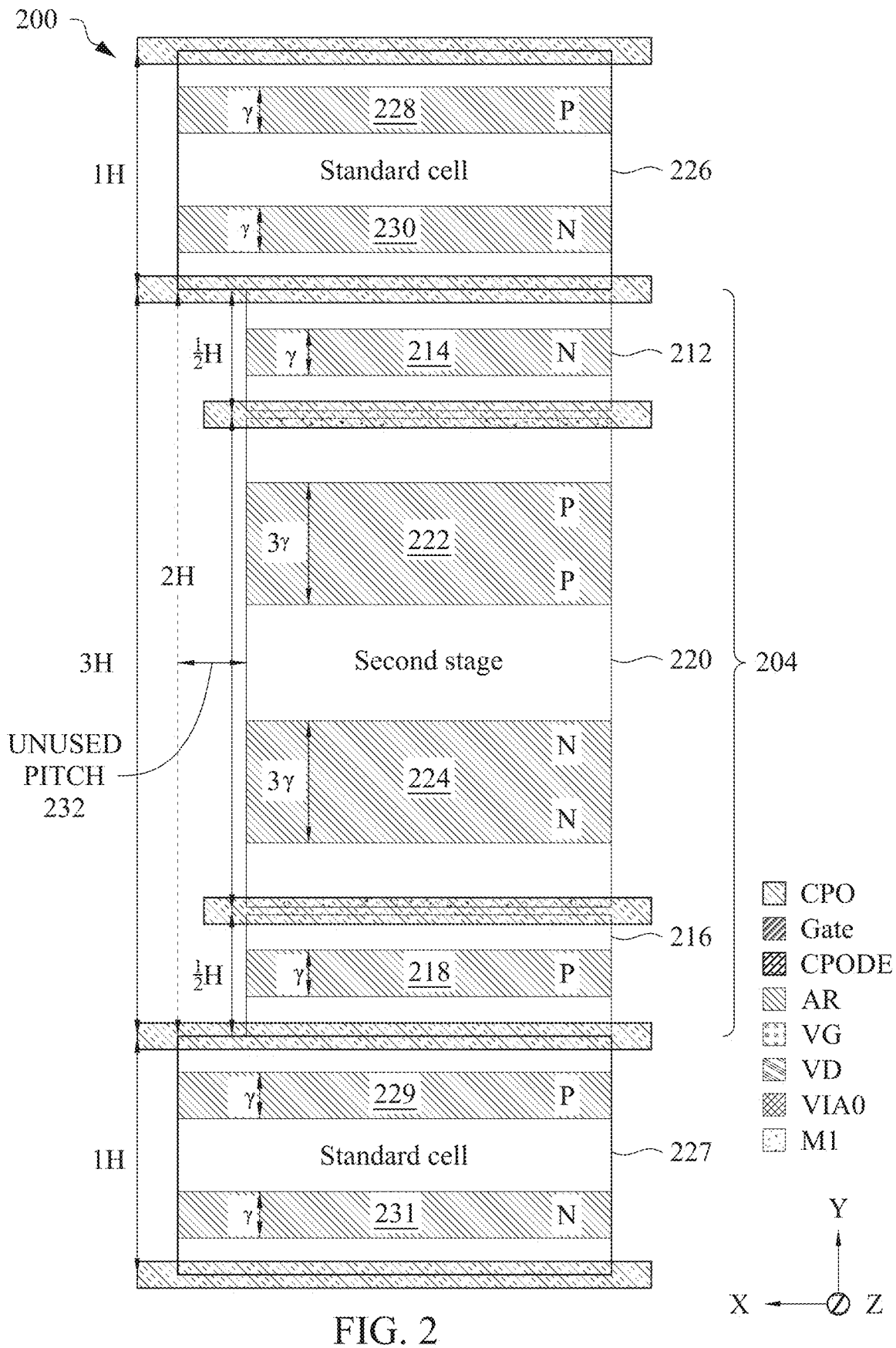
FIG. 2 is a layout diagram of an IC, in accordance with some embodiments.

FIG. 2 is a diagram of an IC 200, in accordance with some embodiments.

In some embodiments, IC 200 is like IC 100 and each of IC 200 and IC 100 are interchangeable. IC 200 includes a multi-cell region 204, which is like circuit region 104 of IC 100. Multi-cell region 204 is includable in IC 100.

Multi-cell region 204 includes a semiconductor cell region 212 that extends in a first direction (e.g., X-axis). Semiconductor cell region 212 includes an active region 214 that extends in the first direction and is configured with an n-type dopant. Relative to a second direction perpendicular to the first direction (e.g., Y-axis), semiconductor cell region 212 has a height of ½H. Multi-cell region 204 further includes a semiconductor cell region 216 that extends in the first direction. Semiconductor cell region 216 includes an active region 218 that extends in the first direction and is configured with a p-type dopant. Relative to the second direction, semiconductor cell region 216 has a height of H. Multi-cell region 204 further includes a semiconductor cell region 220 that extends in the first direction.

Relative to the second direction, semiconductor cell region abuts correspondingly underneath semiconductor cell region 212 and above semiconductor cell region 216. Semiconductor cell region 220 includes active regions 222 and 224 that extend in the first direction and are configured correspondingly with the p-type and n-type dopants. Relative to the second direction, semiconductor cell region 220 has a height of 2H.

Figure 15:
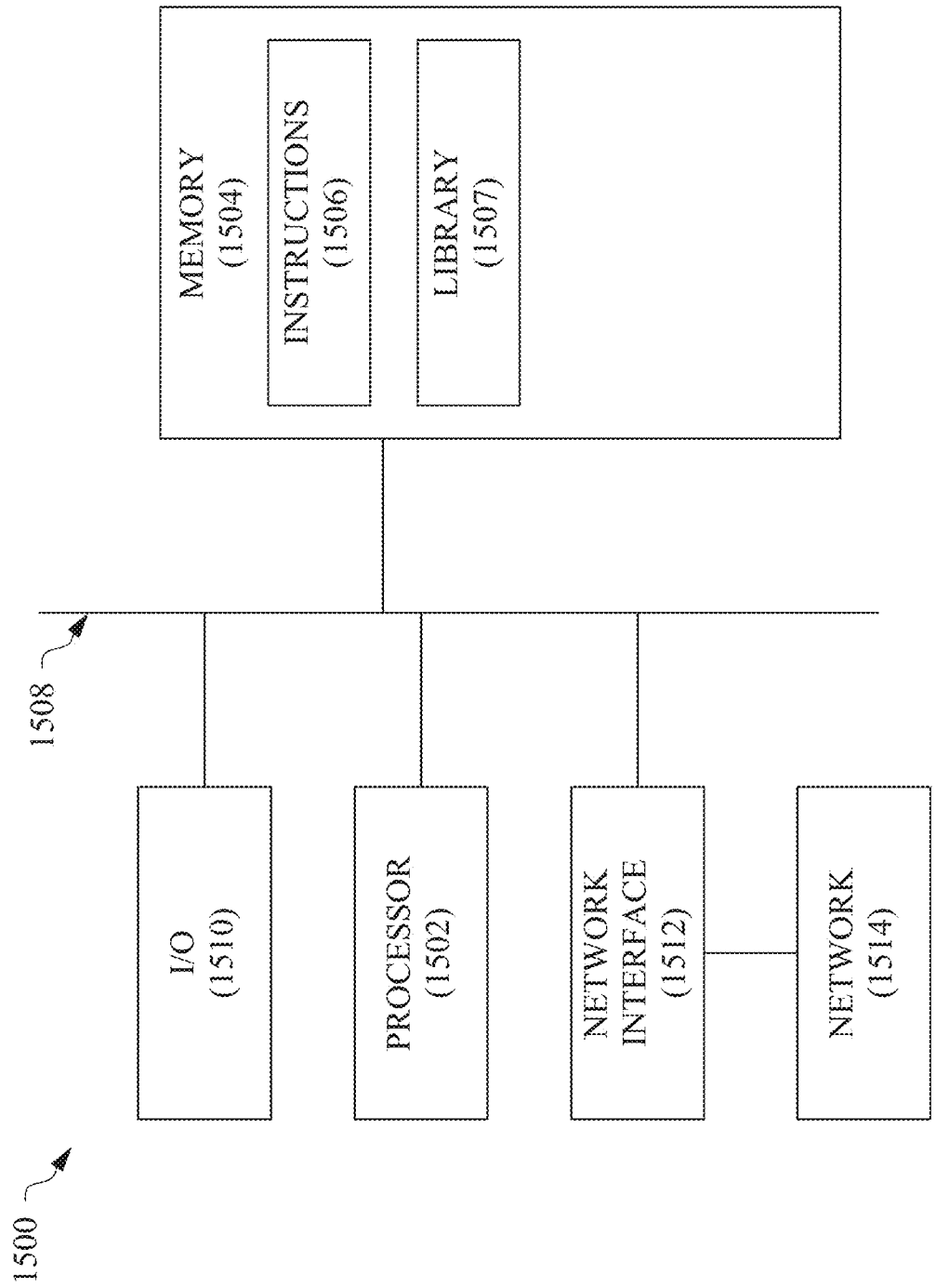
FIG. 15 is a block diagram of an electronic design automation (EDA) system in accordance with some embodiments.

In FIG. 2, IC 200 further includes a cell region 226, e.g., a standard cell region, that abuts multi-cell region 204 relative to the second direction (Y-axis). In some embodiments, cell region 226 is based on a standard cell from a cell library 1507 (FIG. 15). More particularly, cell region 226 abuts multi-cell region 204 from above, i.e., cell region 226 is above multi-cell region 204. Other suitable orientations are within the contemplated scope of the disclosure. Cell region 226 has a height of H. Semiconductor cell region 220 has a height of 2H. Each of semiconductor cell regions 212 and 216 has a height of ½H. Cell region 226 includes active regions 228 and 230 configured correspondingly with the p-type and n-type dopants.

In FIG. 2, IC 200 further includes a cell region 227, e.g., a standard cell region, that abuts multi-cell region 204. In some embodiments, cell region 227 is based on a standard cell from cell library 1507 (FIG. 15) or as discussed above. More particularly, cell region 227 abuts multi-cell region 204 from below, i.e., cell region 227 is underneath multi-cell region 204. Other suitable orientations are within the contemplated scope of the disclosure. Cell region 227 has a height of H. Cell region 227 includes active regions 229 and 231 configured correspondingly with the p-type and n-type dopants.

Relative to the first direction (X-axis), and in comparison with cell region 226, multi-cell region 204 has an unused pitch portion 232. Unused pitch portion 232 represents the former location of a first stage of multi-cell region 204. A counterpart of multi-cell region 204 according to another approach does not include active regions 222 and 224, but instead extends the counterpart of semiconductor cell region 220 (and with its counterparts of active regions 222 and 224) into unused pitch portion 232.

Multi-cell region 204 is organized into a first stage and a second stage. The first stage is represented by semiconductor cell regions 212 and 216. The second stage is represented by semiconductor cell region 220. In contrast to the other approach, semiconductor devices that otherwise would be in unused pitch portion 232 are moved to semiconductor cell regions 212 and 216.

Multi-cell region 204 has an N-PPNN-P dopant-stack architecture, where the single N in N-PPNN-P corresponds to semiconductor cell region 212, the PPNN sequence in N-PPNN-P corresponds to semiconductor cell region 220, and the single P in N-PPNN-P corresponds to semiconductor cell region 216. In some embodiments, relative to the Y-axis, the PPNN sequence refers to a PP region separated from an NN region, where the PP region has a height that is three times the height of the P region in active region 230, and where the NN region has a height that is three times the height of the N region in active region 230. In some embodiments, IC 200 further includes a multi-cell region (not shown) that has a P-NNPP-N dopant-stack architecture and is configurable to abut cell region 226 or cell region 227 relative to the second direction (Y-axis).

Relative to the second direction (Y-axis), heights of active regions 214, 218, 222 and 224 are corresponding multiples of a variable γ, where γ is a unit of measure dependent on the corresponding semiconductor process technology node. In particular, each of active regions 214, 218, 228, 229, 230 and 231 has a height of γ. Each of active regions 222 and 224 has a height of 3γ.

Figure 3A:
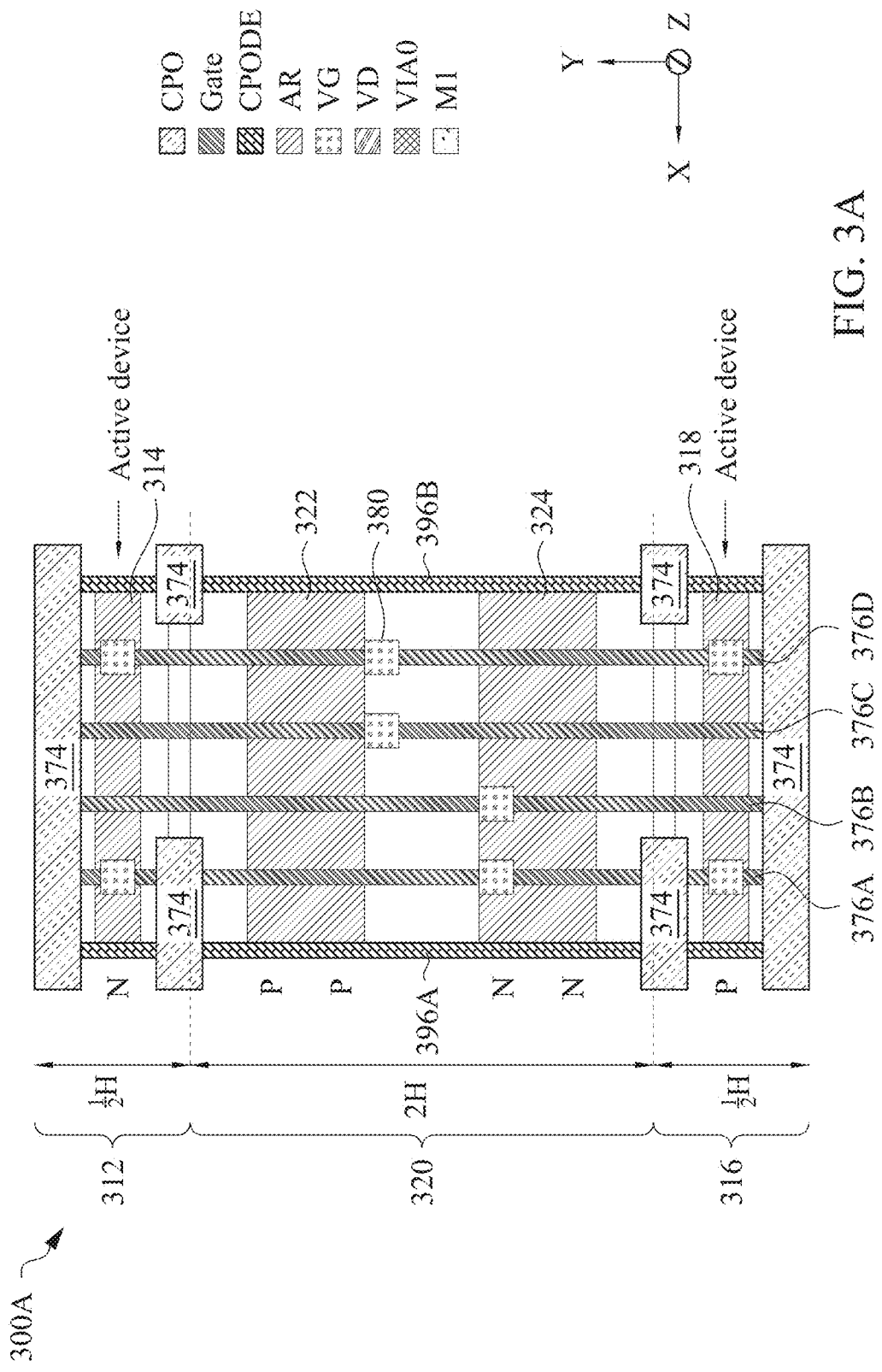
FIGS. 3A and 3B are corresponding layout diagrams of an IC, in accordance with some embodiments.
Figure 3B:
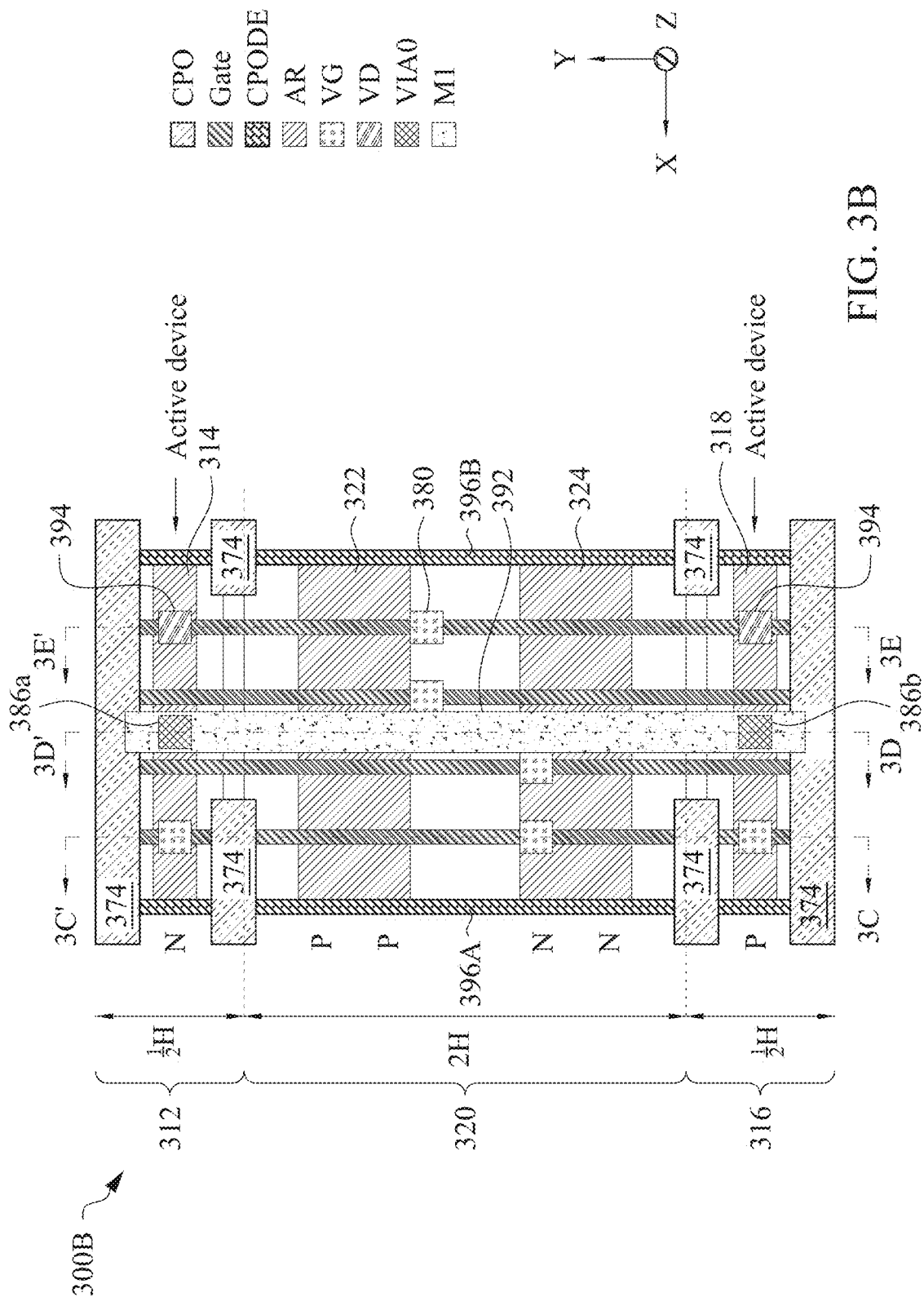

FIGS. 3A and 3B are corresponding layout diagrams 300A and 300B of an IC, in accordance with some embodiments.

Examples of ICs based on layout diagrams 300A and/or 300B include IC 200, IC 100, or the like. Further, layout diagrams 300A and 300B are slightly different. Layout diagram 300B includes additional patterns, such as via-to-drain/source (VD) patterns 394, via patterns 386a, 386b, and metal pattern M1 392.

FIG. 3C is a cross-sectional diagram of layout diagram 300B of FIG. 3B taken along line 3C-3C', in accordance with some embodiments.

FIG. 3D is a cross-sectional diagram of layout diagram 300B of FIG. 3B taken along line 3D-3D', in accordance with some embodiments.

Figure 3E:
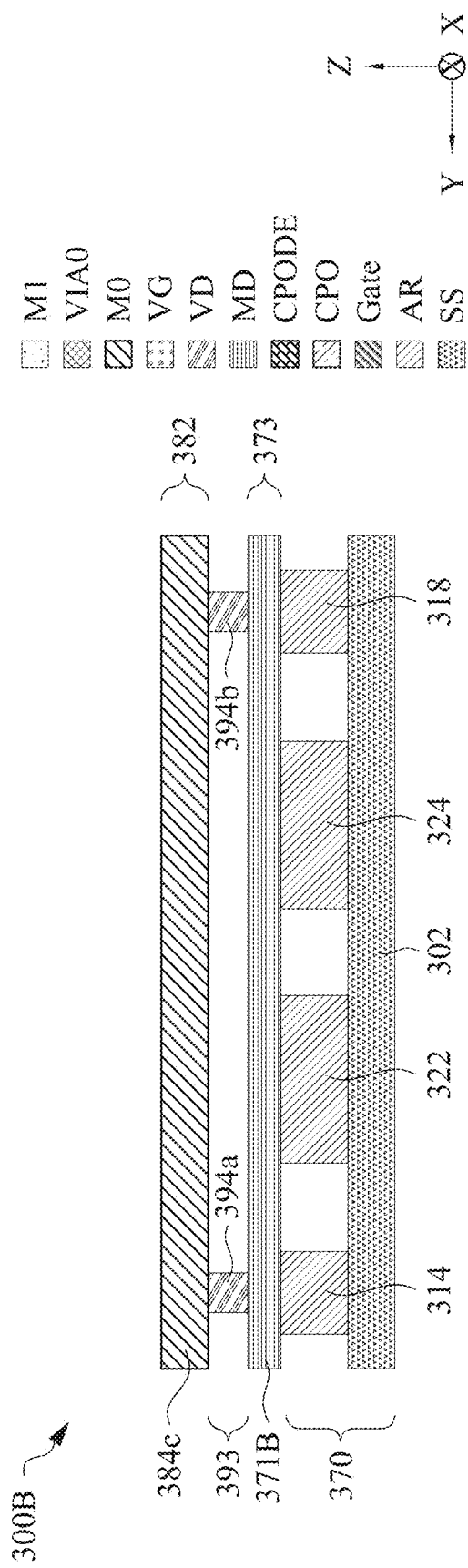
FIG. 3E is a cross-sectional diagram of the layout diagram of FIG. 3B taken along line 3E-3E', in accordance with some embodiments.

FIG. 3E is a cross-sectional diagram of layout diagram 300B of FIG. 3B taken along line 3E-3E', in accordance with some embodiments.

For ease of illustration, some but not all elements of FIGS. 3A-3B are labelled. In some embodiments, layout diagram 300A and/or 300B includes additional elements not shown in FIGS. 3A-3B. The cross-sections correspondingly of FIGS. 3C-3E include elements not shown in FIG. 3B for purposes of simplifying FIG. 3B. For example, FIG. 3C includes an M0 segment 384a for which a corresponding shape is not shown in FIG. 3B. For example, FIG. 3D includes an MD segment 371A and an M0 segment 384b for which corresponding shapes are not shown in FIG. 3B. For example, FIG. 3E includes an MD segment 371B and an M0 segment 384c for which corresponding shapes are not shown in FIG. 3B.

Features of layout diagram 300B of FIG. 3B are located correspondingly in levels of FIGS. 3C-3E. Such levels include active region (AR) level 370, gate level 372, metal-over-source/drain (MD) level 373 of layout diagram 300B. FIGS. 3C-3E include one or more features of layout design 300B of FIG. 3B, e.g., M_1st level 382 of layout diagram 300B. For a given IC structure manufactured according to a given semiconductor process technology node, regardless of whether gate structures in the given IC are formed of polysilicon, some embodiments refer to gate level 372 in the given IC as poly level 372 for the reason of historical convenience, i.e., because gate structures in ICs manufactured according to one or more predecessor semiconductor process technology nodes were formed of polysilicon.

FIGS. 3A and 3B are organized according to first and second perpendicular directions, which correspond to the X-axis and the Y-axis. In some embodiments, the first and second directions correspond to axes other than the X-axis and the Y-axis. Hereinafter, the first and second directions correspondingly are referred to as the first direction X and the second direction Y. Relative to a single height standard cell having a height of 1*H=H, layout diagram 300B has a height 3H in a second direction Y which represents the sum of the corresponding heights of cell 312, cell 320 and cell 316, and where the variable H is a unit of measure dependent on the corresponding semiconductor process technology node. In some embodiments, layout diagram 300B abuts other cell (such as a standard cell) along cell boundaries (not shown).

Each of layout diagram 300A and 300B is representative of an IC. Structures in the IC are represented by patterns (also known as shapes) in layout diagrams 300A and 300B. Each of layout diagrams 300A or 300B includes active region patterns 314, 318, 322, and 324 over a substrate pattern 302 and extending in the first direction X. Active region patterns 314, 318, 322, and 324 are separated from one another in the second direction Y. Active region patterns 314, 318, 322, and 324 are usable to manufacture a corresponding set of active regions 214, 218, 222, and 224 (FIG. 2) of integrated circuit 200.

In some embodiments, active region patterns 314, 318, 322, and 324 are located on a first layout level or AR level 370. In some embodiments, first layout level 370 corresponds to an active level or an AR level of one or more of integrated circuits 200, 400, 600, 800, or 1000 (FIG. 2, 4, 6, 8, or 10), layout diagrams 500, 700, 900, or 1100 (FIGS. 5, 7, 9, and 11), or the like. Other configurations, arrangements on other layout levels or quantities of patterns in the set of active region patterns 314, 318, 322, and 324 are within the scope of the present disclosure.

FIGS. 3D and 3E include corresponding contact patterns 371A and 371B extending in the second direction Y. Each of contact patterns 371A and 371B is separated from an adjacent contact pattern in the first direction X. Contact patterns 371A and 371B are usable to manufacture corresponding contacts in a corresponding IC. In some embodiments, contact patterns 371A and 371B are referred to as metal-over-drain/source (MD) patterns. Contact patterns 371A and 371B are in MD level 373. Portions of contact patterns 371A and 371B correspondingly are usable to manufacture source or drain terminals of one corresponding NMOS or PMOS transistors of integrated circuits 200, 400, 600, 800, or 1000. Contact patterns 371A and 371B overlap correspondingly doped source/drain portions of active region patterns 314, 318, 322, or 324. In some embodiments, at least contact pattern 371A or 371B is over active region pattern 322 and 324. In some embodiments, at least contact pattern 371A or 371B is over active region patterns 314, 318, 322, and 324. Contact patterns 371A and 371B are located in MD level 373. Other configurations, arrangements on other layout levels or quantities of such as contact patterns 371A and 371B are within the scope of the present disclosure.

Layout diagram 300B further includes via patterns 386a or 386b (collectively referred to as a "set of via patterns 386"). The set of via patterns 386 is usable to manufacture a corresponding set of vias in a corresponding IC. The set of via patterns 386 are in a first level of interconnection (VIA_$1^{st}$ level) 388 (see FIG. 3D), which is between a first level of metallization (M_$1^{st}$ level) 382 and a second level of metallization (M_$2^{nd}$ level) 390. FIGS. 3A-3E assume a numbering convention of the corresponding semiconductor process technology node which designates M_$1^{st}$ level 382 and M_$2^{nd}$ level 390 correspondingly as levels M0 and M1, and VIA_$1^{st}$ level 388 as level V0. Accordingly, via patterns 386a and 386b are V0 patterns. In some embodiments, the numbering convention of the corresponding semiconductor process technology node designates M_$1^{st}$ level 382 and M_$2^{nd}$ level 390 correspondingly as to as levels M1 and M2, and VIA_$1^{st}$ level 388 as V1. Other configurations, arrangements on other levels or quantities of patterns in the set of via patterns 386 are within the scope of the present disclosure.

Layout diagram 300B further includes via patterns 394a or 394b (collectively referred to as a "set of via patterns 394"). The set of via patterns 394 is usable to manufacture a corresponding set of vias in a corresponding IC. The set of via patterns 394 are in a via-to-source/drain (VD) level 393 (see FIG. 3E), which is between MD level 373 and M_1st level 382. Via patterns 394a and 394b are over corresponding portions of active region patterns 314 and 318. In some embodiments, set of via patterns 394 are referred to as via-over-MD (VD) patterns. Other configurations, arrangements on other layout levels or quantities of patterns in the set of via patterns 394 are within the scope of the present disclosure.

Layout diagrams 300A and 300B further include: gate patterns 376A, 376B, 376C and 376D (collectively referred to as a "set of gate patterns 376") extending in the second direction Y; and corresponding via-to-gate (VG) structures 380. Each of the gate patterns of the set of gate patterns 376 is separated from an adjacent gate pattern of the set of gate patterns 376 in the first direction X by a first pitch.

Portions of gate patterns 376A-D are usable to manufacture corresponding gates of NMOS and PMOS transistors of a corresponding IC, e.g., IC 400, 600, 800, 1000, or the like. Gate patterns 376A, 376B, 376C and 376D are separated from each other by a distance of one pitch unit, δ. For example, together, gate patterns 376A, 376B, 376C and 376D have a pitch of 4δ. In some embodiments, a minimal distance between a first gate structure and a nearest second gate structure is referred to as a pitch unit δ, where pitch unit δ is a unit of measure dependent on the corresponding semiconductor process technology node. For a given IC structure manufactured according to a given semiconductor process technology node, regardless of whether gate structures in the given IC are formed of polysilicon, some embodiments refer to pitch unit δ as contacted poly pitch (CPP) for the reason of historical convenience, i.e., because gate structures in ICs manufactured according to one or more predecessor semiconductor process technology nodes were formed of polysilicon.

Layout diagrams 300A and 300B further include gate-cut (CPO) patterns 374. Portions of CPO patterns 374 are over portions of corresponding gate patterns 376A-D, which indicates that the underlying portions of gate patterns 376A-D are to be removed during the manufacture of a corresponding IC. Gate patterns 376A-D are above corresponding portions of active region patterns 314, 318, 322, and 324 and substrate pattern 302. Gate patterns 376A-D are in a gate level 372. Other configurations, arrangements on other layout levels or quantities of patterns in the set of gate patterns 376 are within the scope of the present disclosure.

Layout diagrams 300A and 300B further include CPODE patterns 396A and 396B extending in the second direction Y. In some embodiments, CPODE pattern 396A is useable to manufacture a first CPODE structure in a corresponding IC, and CPODE pattern 396B is useable to manufacture a second CPODE structure in the corresponding IC. In some embodiments, a CPODE structure is referred to as a dielectric gate structure. In some embodiments, a dielectric gate is not a structure that is electrically conductive and thus does not function as an active gate of a transistor; rather, a dielectric gate is a dielectric structure that includes one or more dielectric materials and functions as an electrical isolation structure. In some embodiments, a dielectric gate is formed by first forming a dummy gate, sacrificing/removing (e.g., etching) the dummy gate to form a trench, (optionally) removing a portion of a substrate that previously had been under the dummy gate to deepen the trench, and then filling the trench with one or more dielectric materials such that the physical dimensions of the resultant electrical isolation structure are similar to the dimensions of the dummy gate which was sacrificed. Details of dielectric gates are found, e.g., in U.S. Pre-Grant Publication No. 20190386000 or U.S. Pre-Grant Publication No. 20170358584, the entirety of each of which is hereby incorporated by reference.

Together, CPODE pattern 396A and gate pattern 376A have a pitch of 2δ. Together, gate pattern 376D and CPODE pattern 396B have a pitch of 2δ. Together, gate patterns 376A-D and CPODE patterns 396A-B have a pitch of 5δ, i.e., each of layout diagrams 300A and 300B has a pitch of 5δ.

Relative to the first direction X, corresponding portions of CPODE patterns 396A are on the left edges of cells 312, 316 and 320, and corresponding portions of CPODE patterns 396B are on the right edges of cells 312, 316 and 320. In some embodiments, CPODE patterns 396A-B are in gate level 372. Portions of CPO patterns 374 are over corresponding portions of CPODE patterns 396A-B, which indicates that the corresponding underlying portions of the predecessor dummy gate patterns (not shown) which precede CPODE patterns 396A-B are to be removed during the manufacture of a corresponding IC. Other configurations, arrangements on other layout levels or quantities of CPODE patterns 396A-B are within the scope of the present disclosure.

Included, but not shown, in layout diagram 300B (see instead FIGS. 3C-3E) are conductive feature patterns 384a, 384b, and 384c (herein after the set of conductive feature patterns 384) extending in the second direction Y, and being located in M0 level 382.

Layout diagram 300B further includes a conductive feature pattern 392 extending in the second direction Y, and being located in M1 level 390. Conductive feature pattern 392 is usable to manufacture conductive structure in a corresponding IC.

In FIGS. 3A and 3B, each of corresponding layout diagrams 300A and 300B includes a pair of cells 312 and 316 and a cell 320. Relative to a single height standard cell of height H in the second direction Y, each of cells 312 and 316 has a height of ½H, and cell 320 has a height of 2H. Cells 312, 316 and 320 have corresponding widths in the first direction X. Relative to the second direction Y, each of cells 312, 316 and 320 abut one another to create an N-PPNN-P sequence that represents an N-PPNN-P dopant-stack architecture of a corresponding IC. Further, each of layout diagrams 300A and 300B is able to be abutted to one or more standard cells, non-standard cells or other suitable circuit design library cells that are within the contemplated scope of the disclosure.

Relative to the second direction Y, a boundary between cells 312 and 320 is overlapped by a first subset of instances of CPO pattern 374, and a boundary between cells 320 and 316 is overlapped by a second subset of instances of CPO pattern 374.

In FIGS. 3A-3B, relative to Y-axis, lengths of the corresponding portions of CPODE patterns 396A and 396B define cell 312 as having height ½H, cell 320 as having height 2H, and cell 316 as having height ½H. Accordingly, in a semiconductor device based on layout diagram 300A or 300B, lengths of the corresponding portions of CPODE structures based on CPODE patterns 396A and 396B define a cell region based on cell 312 as having height ½H, a cell region based on cell 320 as having height 2H, and a cell region based on cell 316 as having height ½H.

Figure 4:
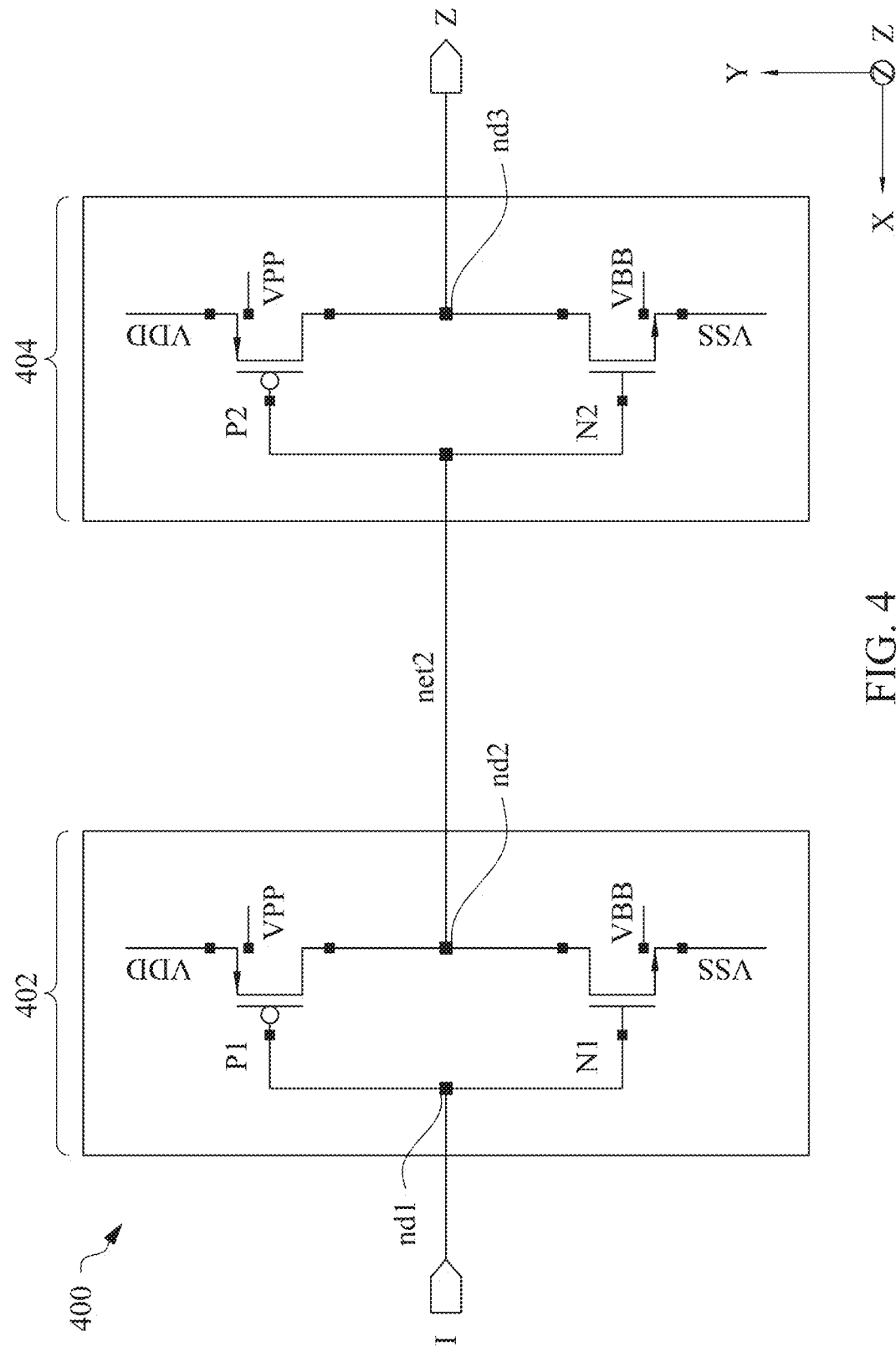
FIG. 4 is a schematic diagram of an integrated circuit, in accordance with some embodiments.

FIG. 4 is a schematic diagram of an integrated circuit 400, in accordance with some embodiments.

Figure 5:
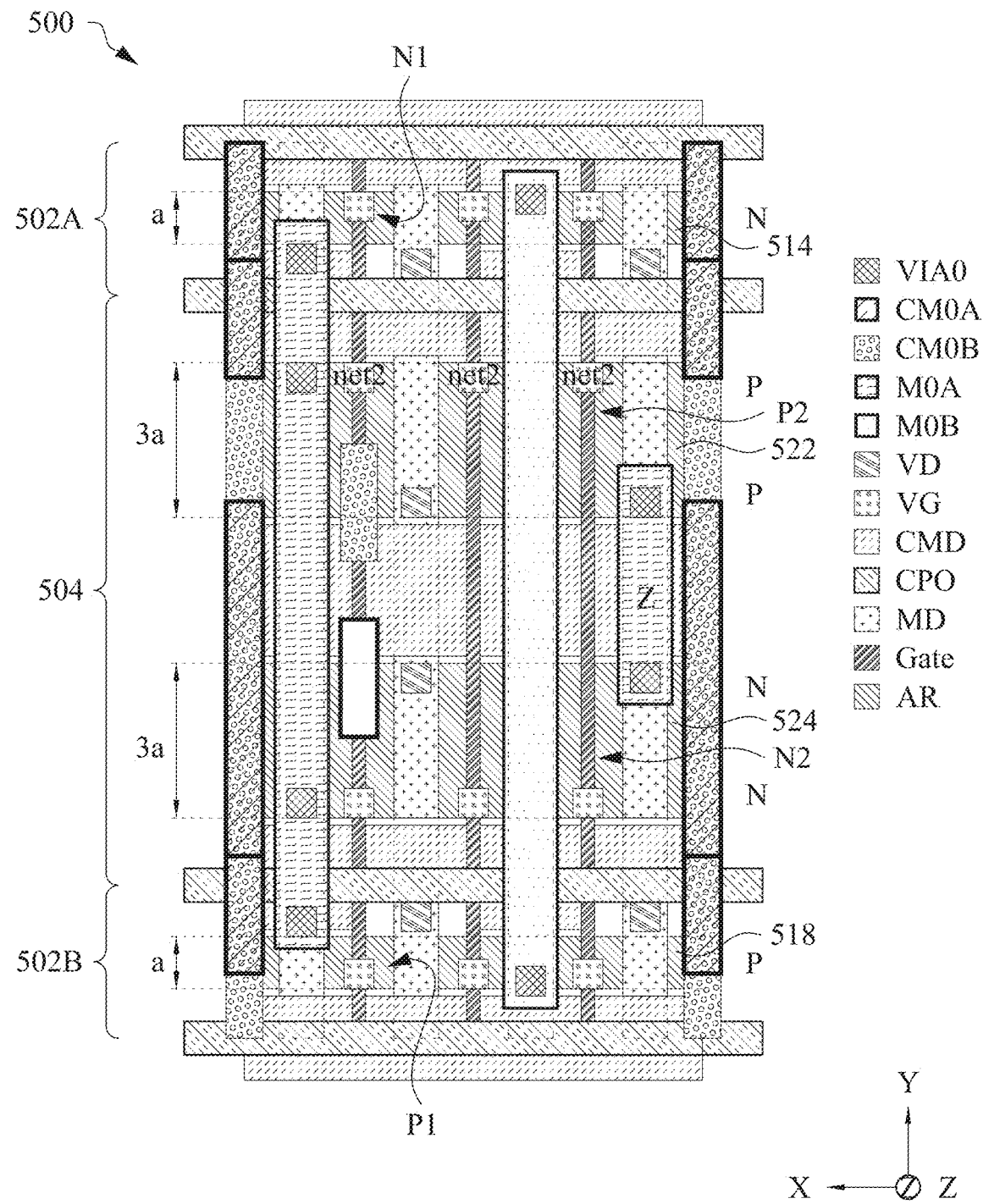
FIG. 5 is a layout diagram of the integrated circuit of FIG. 4, in accordance with some embodiments.

FIG. 5 is a layout diagram 500 of integrated circuit 400 of FIG. 4, in accordance with some embodiments.

IC 400 is a buffer circuit. IC 400 includes a pair of series-coupled inverters 402 and 404. Inverter 402 includes a PMOS transistor P1 and an NMOS transistor N1. Gates of P1 and N1 are coupled together at node 1 (nd1) and are configured to receive an input I. A source of P1 is coupled to a voltage supply VDD. A drain of P1 is coupled to the drain of transistor N1 and node 2 (nd2). A source of N1 is coupled to a voltage supply VSS.

Inverter 404 includes a PMOS transistor P2 and an NMOS transistor N2. Gates of transistor P2 and transistor N2 are coupled together at node 2 (nd2) and are configured to receive an input net2. A source of transistor P2 is coupled to a voltage supply VDD. A drain of transistor P2 is coupled to the drain of transistor N2 and node 3 (nd3). A source of transistor N2 is coupled to a voltage supply VSS.

In operation, when input I is above a threshold of inverter 402, then the output at nd2 is an inverted signal of the input I. Further, when I is below a threshold of inverter 402, then the output at nd2 is an inverted signal of the input I. When input I remains the same, then nd2 remains the inverted signal of I. The output at nd2 is further inverted at inverter cell 404 when a signal at nd2 is above a threshold of inverter 404, then the output at nd3 (e.g., Z) is an inverted signal of the signal at nd2. Further, when a signal at nd2 is below a threshold of inverter 404, then the output at nd3 is an inverted signal of the signal at nd2. When input the signal at nd2 remains the same, then the signal at nd3 remains the inverted signal of nd2.

Layout diagram 500 of FIG. 5 is a buffer cell and is used to manufacture buffer circuit 400. Buffer cell 500 includes an inverter cell formed of cells 502A and 502B, and an inverter cell 504.

In layout diagram 500, cells 502A and 502B of inverter 402 are shown as being split apart. Cell 502A has an NMOS configuration that includes transistor N1. Cell 502B has a PMOS configuration that includes transistor P1. Cell 502A is like cell 312 and cell 502B is like cell 316 of FIGS. 3A-3B. Each of cells 502A and 502B has a height of H. Cell 502A has a single NMOS active region 514. Cell 502B has a single PMOS active region pattern 518.

Inverter 404 is shown in FIG. 5 as cell 504 that includes transistor N2 and P2. Inverter cell 504 is like cell 320 of FIGS. 3A-3B. Cell 505 has a height of 2H, a single NMOS active region pattern 524, and a single PMOS active region pattern 522.

In FIG. 5, relative to the X-axis, the leftmost gate pattern is a dummy gate pattern which correspondingly defines the left edges of cells 502A, 502B and inverter cell 504. Also, relative to the X-axis, the rightmost gate pattern is a dummy gate pattern which correspondingly defines the right edges of cells 502A, 502B and inverter cell 504. Relative to Y-axis, lengths of the corresponding portions of the leftmost and rightmost gate patterns define cell 502A as having height ½H, inverter cell 504 as having height 2H, and cell 502B as having height ½H. Accordingly, in a semiconductor device based on layout diagram 500, lengths of the corresponding portions of dummy gate structures based on the leftmost and rightmost dummy gate patterns define a cell region based on cell 502A as having height ½H, a cell region based on inverter cell 504 as having height 2H, and a cell region based on cell 502B as having height ½H. In some embodiments, the leftmost and rightmost dummy gate patterns are replaced by corresponding CPODE patterns (not shown).

Relative to second direction Y, buffer cell 500 is configured to be abutted to a standard cell, e.g., without any empty space in between. Buffer cell 500 has a pitch of 4δ. According to another approach, the active regions of transistors P2 and N2 were extended in the first direction X to accommodate the formation of transistors corresponding to transistors N1 and P1, with a result that the pitch in the first direction X of the other approach's buffer cell was 5δ, i.e., was greater than the pitch of buffer cell 500 by 1δ. Recalling that the pitch of buffer cell 500 is 4δ, by moving transistors N1 and P1 to corresponding cells 502A and 502B, the pitch of buffer cell 500 is reduced by 1δ as compared to the other approach, i.e., the footprint of buffer cell 500 is narrowed albeit while a height of buffer cell 500 in the second direction Y is increased. Typically, a given IC uses many instances of buffer cell 500 so that the cumulative pitch-savings of 1δ per cell significantly contributes to a reduction in the overall footprint of the given IC as compared to the other approach.

Figure 6:
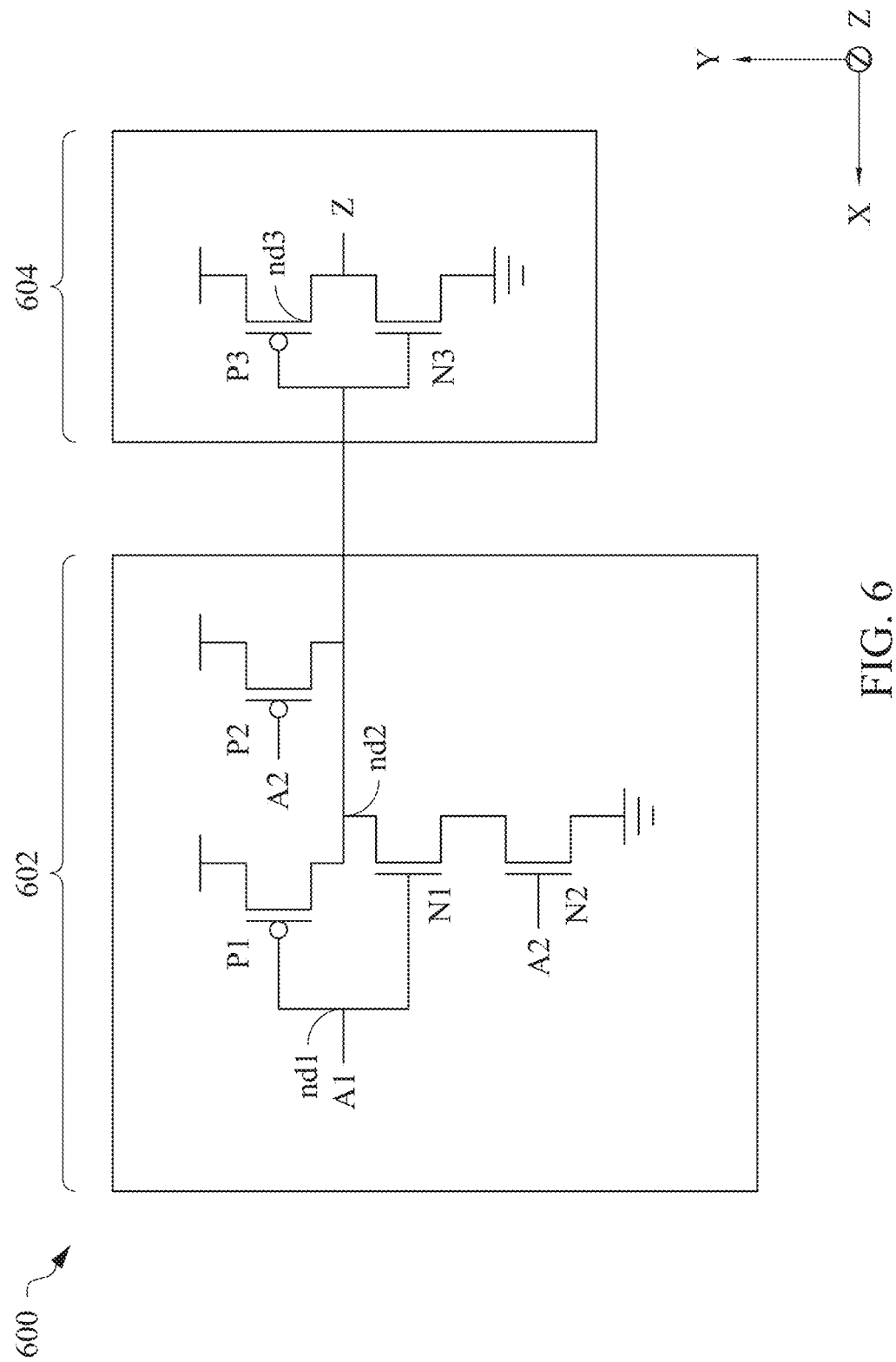
FIG. 6 is a schematic diagram of an integrated circuit, in accordance with some embodiments.

FIG. 6 is a schematic diagram of an integrated circuit 600, in accordance with some embodiments.

Figure 7:
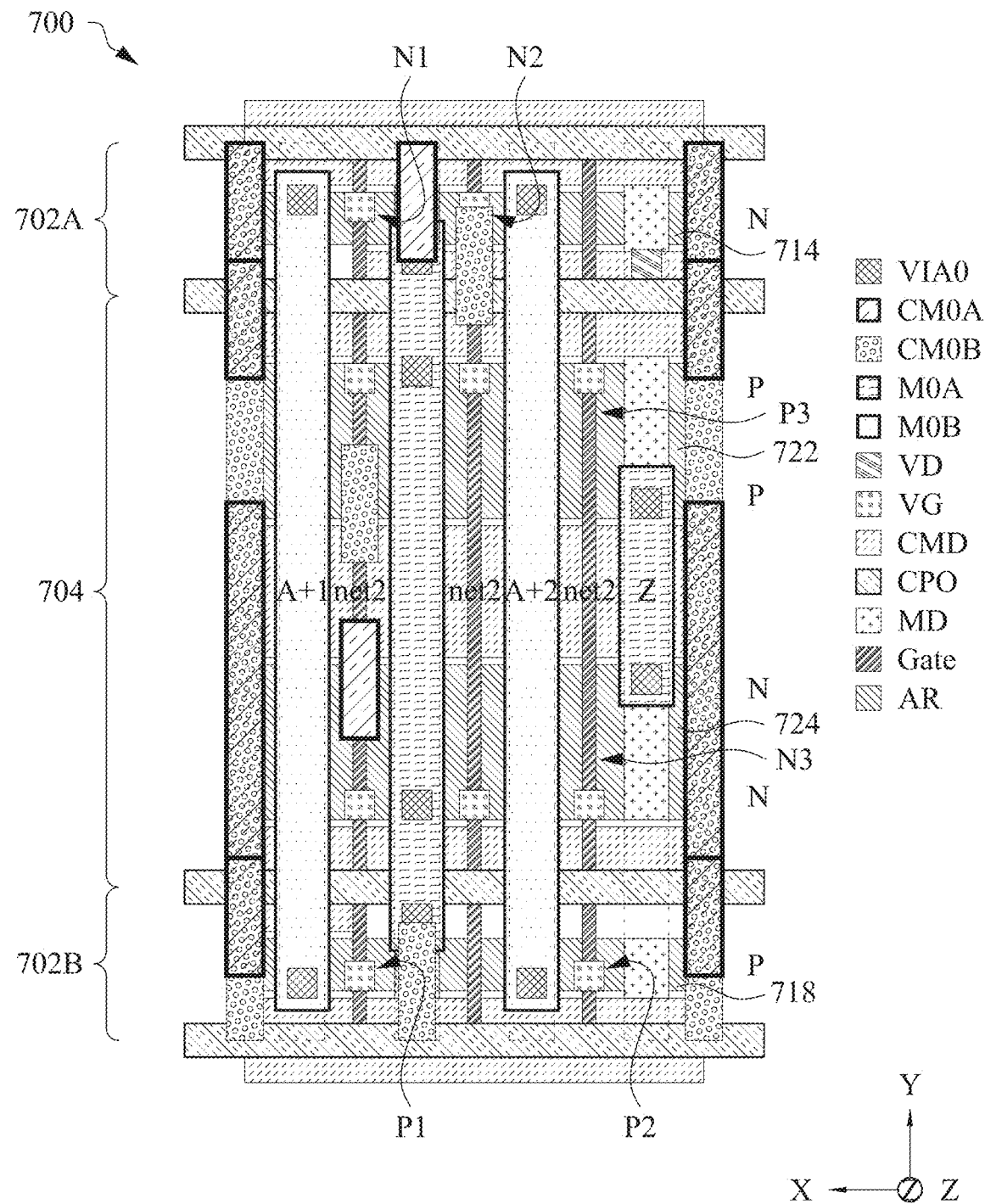
FIG. 7 is a layout diagram of the integrated circuit of FIG. 6, in accordance with some embodiments.

FIG. 7 is a layout diagram 700 of integrated circuit 600 of FIG. 6, in accordance with some embodiments.

IC 600 is a circuit representing a logical AND gate. IC 600 includes a first stage circuit 602 coupled in series to a second stage circuit 604. First stage circuit 602 includes PMOS transistors P1 and P2 and NMOS transistors N1 and N2. Gates of transistor P1 and transistor N1 are coupled together at node 1 (nd1) and are configured to receive an input A1. A source of transistor P1 is coupled to a voltage supply VDD. A drain of transistor P1 is coupled to the drain of transistor N1 and node 2 (nd2). A source of transistor N1 is coupled to a drain of transistor N2. A gate of transistor N2 is coupled to a second input A2 and a source of transistor N2 is coupled to a voltage supply VSS or ground. Further coupled to input A2 is transistor P2 that further has a drain coupled to nd2. A source of transistor P2 is coupled to a voltage supply VDD.

Second stage circuit 604 includes PMOS transistor P3 and NMOS transistor N3. Gates of transistor P3 and transistor N3 are coupled together at node 2 (nd2) and are configured to receive an input signal. A source of transistor P3 is coupled to a voltage supply VDD. A drain of transistor P3 is coupled to the drain of transistor N3 and node 3 (nd3). A source of N2 is coupled to a voltage supply VSS.

Layout diagram 700 of FIG. 7 is a logical AND cell used to manufacture or generate AND gate 600. The pitch of AND cell 700 is 4δ.

In AND cell 700, first stage circuit 602 of AND gate 600 is represented as being split into NMOS cell 702A that includes transistors N1 and N2, and PMOS cell 702B that includes transistors P1 and P2. Cell 702A is like cell 312 and cell 702B is like cell 316. Each of cells 702A and 702B has a height of H. Cell 702A has a single NMOS active region pattern 714. Cell 702B has a single PMOS active region pattern 718.

Second stage circuit 604 of AND gate 600 is represented in FIG. 7 as a cell 704 that includes transistors N3 and P3. Cell 704 is like cell 320. Cell 704 has a height of 2H, a single NMOS active region 724, and single PMOS active region 722.

In FIG. 7, relative to the X-axis, the leftmost gate pattern is a dummy gate pattern which correspondingly defines the left edges of cells 702A, 702B and 704. Also, relative to the X-axis, the rightmost gate pattern is a dummy gate pattern which correspondingly defines the right edges of cells 702A, 702B and 704. Relative to Y-axis, lengths of the corresponding portions of the leftmost and rightmost gate patterns define cell 702A as having height ½H, cell 704 as having height 2H, and cell 702B as having height ½H. Accordingly, in a semiconductor device based on layout diagram 700, lengths of the corresponding portions of dummy gate structures based on the leftmost and rightmost dummy gate patterns define a cell region based on cell 702A as having height ½H, a cell region based on cell 704 as having height 2H, and a cell region based on cell 702B as having height ½H. In some embodiments, the leftmost and rightmost dummy gate patterns are replaced by corresponding CPODE patterns (not shown).

Relative to second direction Y, AND cell 700 is configured to be abutted to a standard cell, e.g., without any empty space in between. According to another approach, the active regions of transistors P3 and N3 were extended in the first direction X to accommodate the formation of transistors corresponding to transistors N1, N2, P1 and P2, with a result that the pitch in the first direction X of the other approach's AND cell was 6δ, i.e., was greater than the pitch of AND cell 700 by 2δ. Recalling that the pitch of AND cell 700 is 4δ, by moving transistors N1, N2 and P1, P2 to corresponding cells 702A and 702B, the pitch of AND cell 700 is reduced by 2δ as compared to the other approach, i.e., the footprint of AND cell 700 is narrowed albeit while a height of AND cell 700 in the second direction Y is increased. Typically, a given IC uses many instances of AND cell 700 so that the cumulative pitch-savings of 2δ per cell significantly contributes to a reduction in the overall footprint of the given IC as compared to the other approach.

Figure 8:
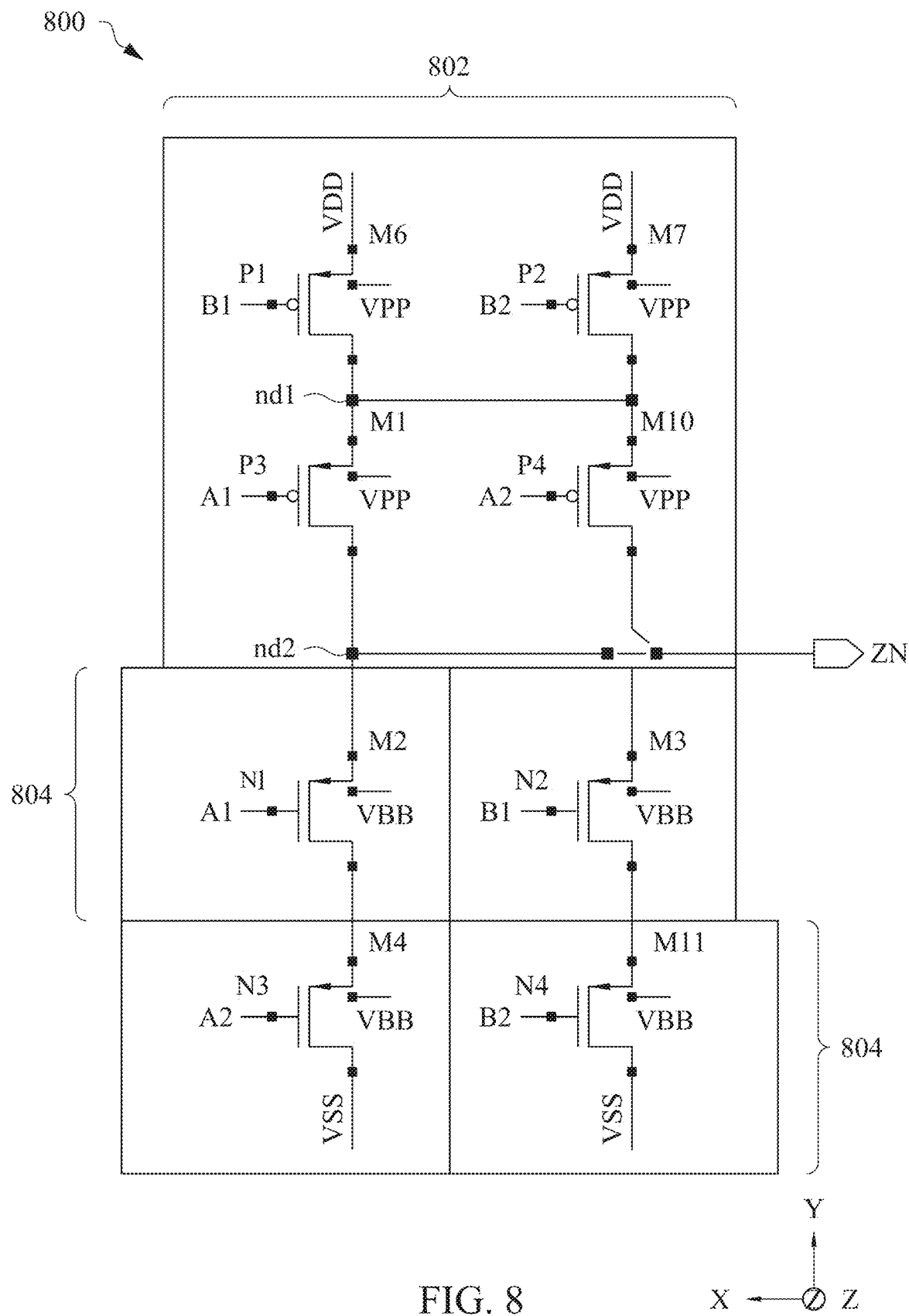
FIG. 8 is a schematic diagram of an integrated circuit, in accordance with some embodiments.

FIG. 8 is a schematic diagram of an integrated circuit 800, in accordance with some embodiments.

Figure 9:
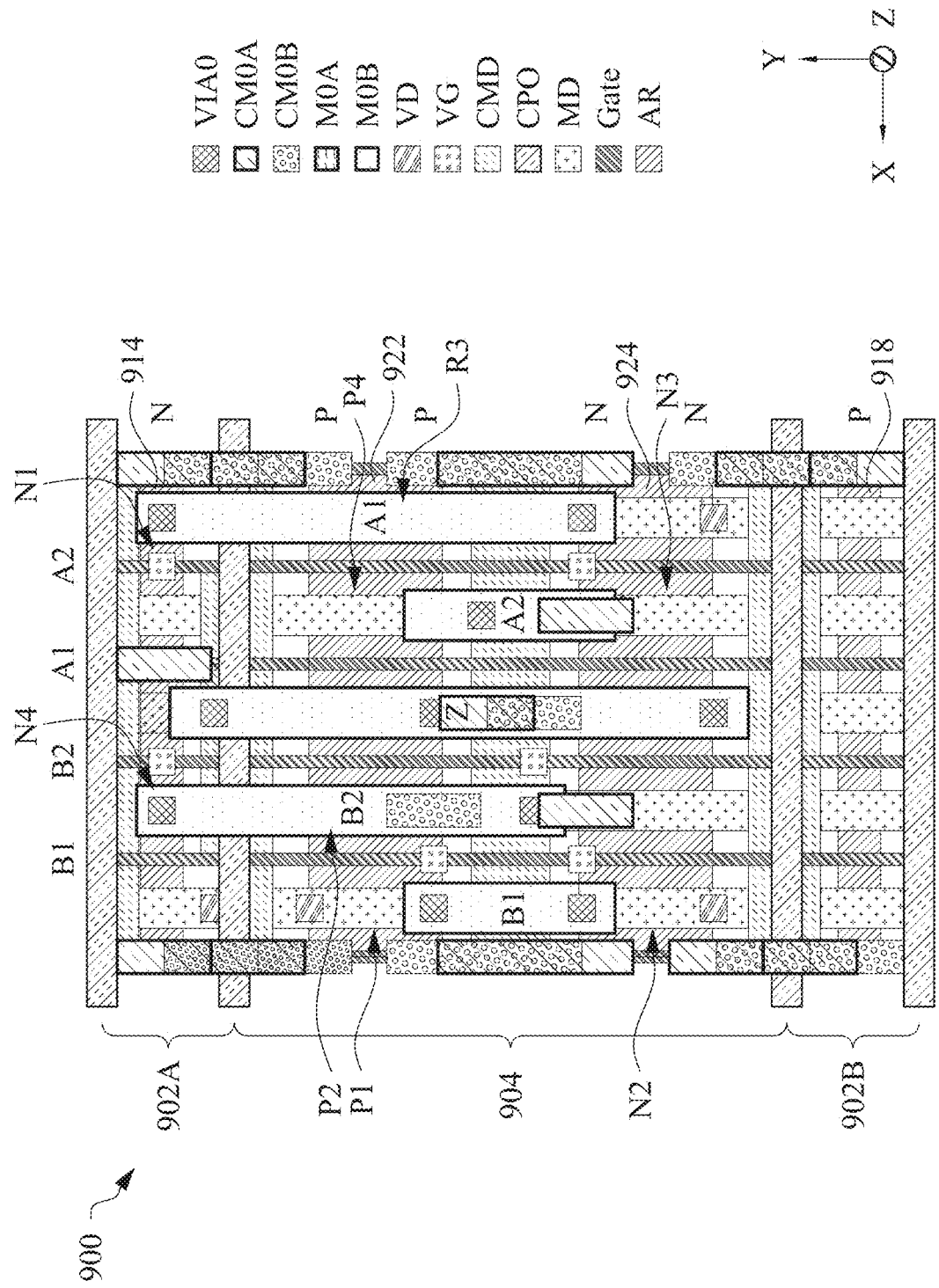
FIG. 9 is a layout diagram of the integrated circuit of FIG. 8, in accordance with some embodiments.

FIG. 9 is a layout diagram 900 of integrated circuit 800 of FIG. 8, in accordance with some embodiments.

IC 800 is a circuit representing a logical AND-OR-INVERT (AOI) gate. IC 800 includes a first stage circuit 802 and second stage circuit 804. First stage circuit 802 includes PMOS transistors P1, P2, P3, and P4 and NMOS transistors N2 and N3. The gate of transistor P1 is coupled to input B1 that is also coupled to the gate of transistor N2. The source of transistor P1 is coupled to voltage supply VDD. The drain of transistor P1 is coupled to source of transistor P3 and nd1. The gate of transistor P2 is coupled to input B2 that is also coupled to the gate of transistor N4. The source of transistor P2 is coupled to voltage supply VDD. The drain of transistor P2 is coupled to source of transistor P4 and nd1. The gate of transistor P3 is coupled to input A1 that is also coupled to the gate of transistor N1. The source of transistor P3 is coupled to nd1. The drain of transistor P3 is coupled to a drain of transistor N1 and nd2. The gate of transistor P4 is coupled to input A2 that is also coupled to the gate of transistor N3. The source of transistor P4 is coupled to nd1. The drain of transistor P4 is coupled to a drain of transistor N2 and nd2. The gate of transistor N2 is coupled to input B1 that is also coupled to the gate of transistor P1. The source of transistor N2 coupled to a drain of transistor N4. The drain of transistor N2 is coupled to a drain of transistor P4 and nd2. Further, the gate of transistor N3 is coupled to input A2 that is also coupled to the gate of transistor P4. The source of transistor N3 is coupled to voltage supply VSS. The drain of transistor N3 is coupled to source of transistor N1.

Second stage circuit 804 includes NMOS transistors N1 and N4. The gate of transistor N1 is coupled to signal A1 that is also coupled to gate of transistor P3. The drain of transistor N1 is coupled to a source of transistor P3 and nd2. The source of transistor N1 is coupled to a drain of transistor N3. The gate of transistor N4 is coupled to signal B2 that is also coupled to gate of transistor P2. The drain of transistor N4 is coupled to a source of transistor N2. The source of transistor N4 is coupled to a voltage supply VSS.

Layout diagram 900 is a logical AOI cell used to manufacture or generate AOI gate 800. The pitch of AOI cell 900 is 5δ.

In AOI cell 900 of FIG. 9, first stage circuit 802 of AOI gate 800 is represented as a cell 904 that includes transistors P1, P2, P3, P4, N2 and N3. Cell 904 is like cell 320. Cell 904 has a height 2H cell, a single NMOS active region pattern 924, and single PMOS active region pattern 922.

In AOI cell 900 of FIG. 9, second stage circuit 804 is represented as two cells 902A and 902B which are split apart. Cell 902A has an NMOS configuration that includes transistors N1 and N4. Cell 902B has a PMOS configuration that does not include any active transistors. Cell 902A is like cell 312 and cell 902B is like cell 316. Each of cells 902A and 902B has a height of H. Cell 902A has a single NMOS active region pattern 914. Cell 902B has single PMOS active region pattern 918. In cell 902B, each MD pattern and each gate pattern is inactive. In some embodiments, in cell 902B, each MD pattern and each gate pattern is left floating.

In FIG. 9, relative to the X-axis, the leftmost gate pattern is a dummy gate pattern which correspondingly defines the left edges of cells 902A, 902B and 904. Also, relative to the X-axis, the rightmost gate pattern is a dummy gate pattern which correspondingly defines the right edges of cells 902A, 902B and 904. Relative to Y-axis, lengths of the corresponding portions of the leftmost and rightmost gate patterns define cell 902A as having height ½H, cell 904 as having height 2H, and cell 902B as having height ½H. Accordingly, in a semiconductor device based on layout diagram 900, lengths of the corresponding portions of dummy gate structures based on the leftmost and rightmost dummy gate patterns define a cell region based on cell 902A as having height ½H, a cell region based on cell 904 as having height 2H, and a cell region based on cell 902B as having height ½H. In some embodiments, the leftmost and rightmost dummy gate patterns are replaced by corresponding CPODE patterns (not shown).

Relative to second direction Y, AOI cell 900 is configured to be abutted to a standard cell, e.g., without any empty space in between. According to another approach, the active regions of transistors P1, P2, P3, P4, N2 and N3 were extended in the first direction X to accommodate the formation of transistors corresponding to transistors N1 and N4, with a result that the pitch in the first direction X of the other approach's AOI cell was 9δ, i.e., was greater than the pitch of AOI cell 900 by 3δ. Recalling that the pitch of AOI cell 900 is 5δ, by moving transistors N1 and N4 to corresponding cell 902A of AOI cell 900, the pitch of AOI cell 900 is reduced by 4δ as compared to the other approach, i.e., the footprint of AOI cell 900 is narrowed albeit while a height of AOI cell 900 in the second direction Y is increased. Typically, a given IC uses many instances of AOI cell 900 so that the cumulative pitch-savings of 4δ per cell significantly contributes to a reduction in the overall footprint of the given IC as compared to the other approach.

Figure 10:
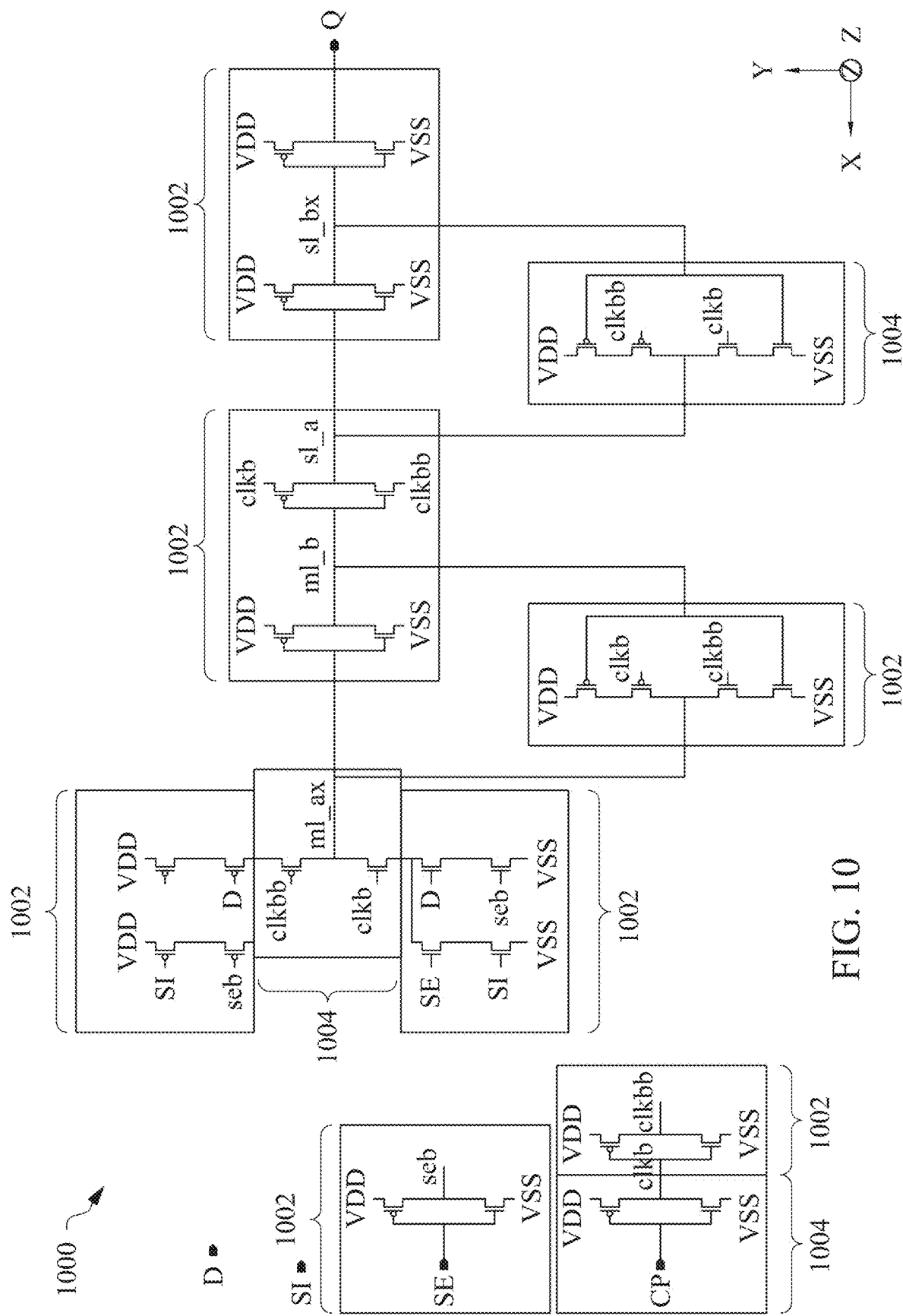
FIG. 10 is a schematic diagram of an integrated circuit, in accordance with some embodiments.

FIG. 10 is a schematic diagram of an integrated circuit 1000, in accordance with some embodiments.

Figure 11:
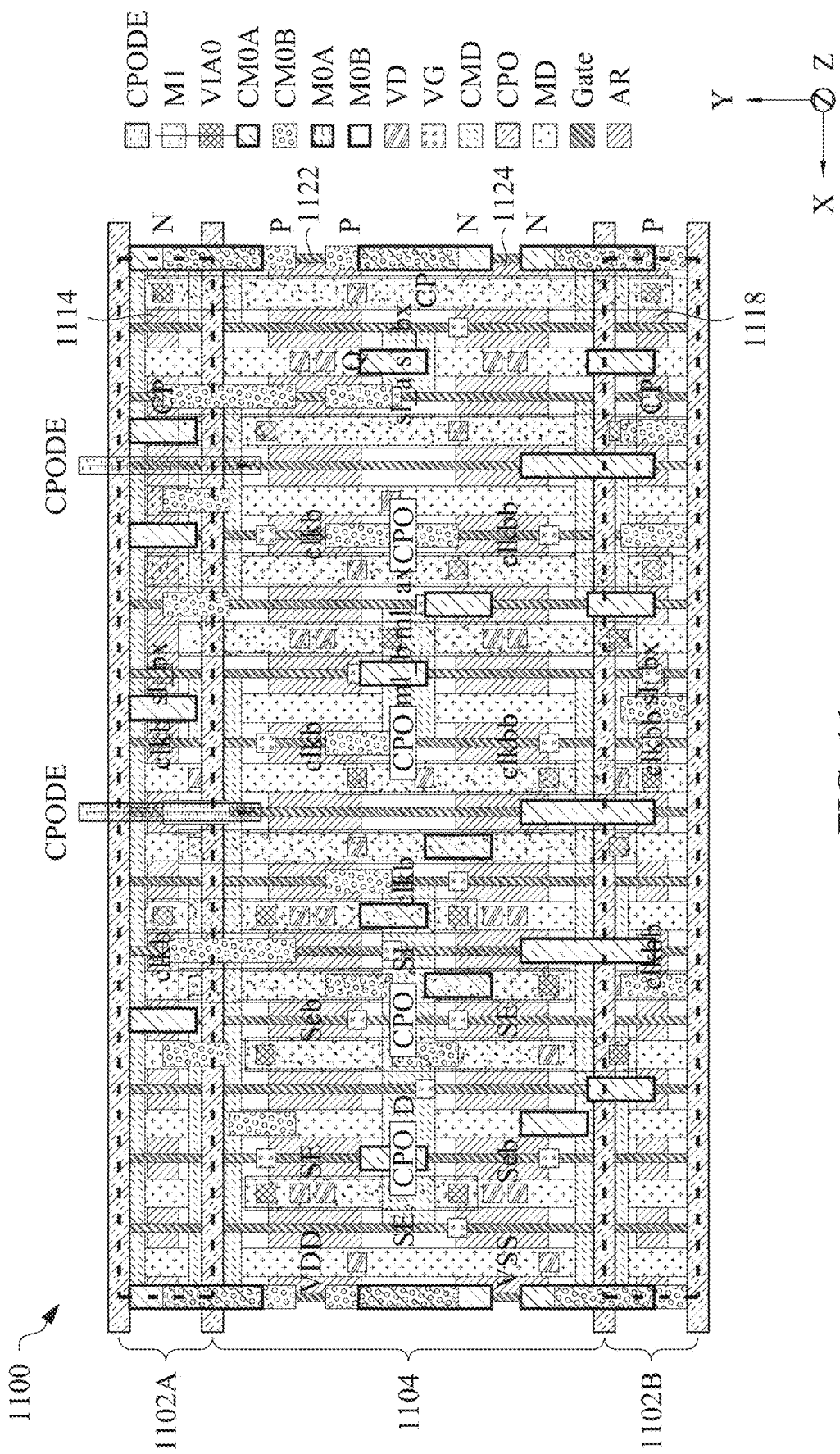
FIG. 11 is a layout diagram of the integrated circuit of FIG. 10, in accordance with some embodiments.

FIG. 11 is a layout diagram 1100 of integrated circuit 1000 of FIG. 10, in accordance with some embodiments.

IC 1000 is a circuit representing a scan D flip-flop (SDFF). IC 1000 includes 7 instances of a first stage circuits 1002 and 3 instances of a second stage circuits 1004.

Regarding operation, SDFF 1000 is a D flip-flop with a multiplexer added at the input. One input of the multiplexer serves as the functional input D, with the other input the multiplexer serving as the Scan-In (SI) input. Various scan/test enable (SE/TE) signals are used to control the multiplexer selection bit.

Layout diagram 1100 of FIG. 11 is an SDFF cell used to manufacture or generate SDFF 1000. The pitch of SDFF cell 1100 is 15δ.

In SDFF cell 1100, first stage circuit 1002 is represented as cell 1104. Cell 1104 includes a PP-type active region pattern 1122 and a NN-type active region pattern 1124. In SDFF cell 1100, second stage circuit 1004 is represented as two cells 1102A and 1102B that are split apart. Cell 1102A includes an N-type active region pattern 1114. Cell 1102B includes a P-type active region pattern 1118.

Relative to second direction Y, SDFF cell 1100 is configured to be abutted to a standard cell, e.g., without any empty space in between.

In FIG. 11, relative to the X-axis, the leftmost gate pattern is a dummy gate pattern which correspondingly defines the left edges of cells 1102A, 1102B and 1104. Also, relative to the X-axis, the rightmost gate pattern is a dummy gate pattern which correspondingly defines the right edges of cells 1102A, 1102B and 1104. Relative to Y-axis, lengths of the corresponding portions of the leftmost and rightmost gate patterns define cell 1102A as having height ½H, cell 1104 as having height 2H, and cell 1102B as having height ½H. Accordingly, in a semiconductor device based on layout diagram 1100, lengths of the corresponding portions of dummy gate structures based on the leftmost and rightmost dummy gate patterns define a cell region based on cell 1102A as having height ½H, a cell region based on cell 1104 as having height 2H, and a cell region based on cell 1102B as having height ½H. In some embodiments, the leftmost and rightmost dummy gate patterns are replaced by corresponding CPODE patterns (not shown).

According to another approach, the active regions of transistors in the other approach's counterpart of cell 1104 were extended in the first direction X to accommodate the formation of transistors in the other approach's counterparts of cells 1102A and 1102B, with a result that the pitch in the first direction X of the other approach's SDFF cell was 19δ, i.e., was greater than the pitch of SDFF cell 1100 by 4δ. Recalling that the pitch of SDFF cell 1100 is 15δ, by moving transistors to corresponding cells 1102A and 1102B, the pitch of SDFF cell 1100 is reduced by 4δ as compared to the other approach, i.e., the footprint of SDFF cell 1100 is narrowed albeit while a height of SDFF cell 1100 in the second direction Y is increased. Typically, a given IC uses many instances of SDFF cell 1100 so that the cumulative pitch-savings of 4δ per cell significantly contributes to a reduction in the overall footprint of the given IC as compared to the other approach.

Figure 12:
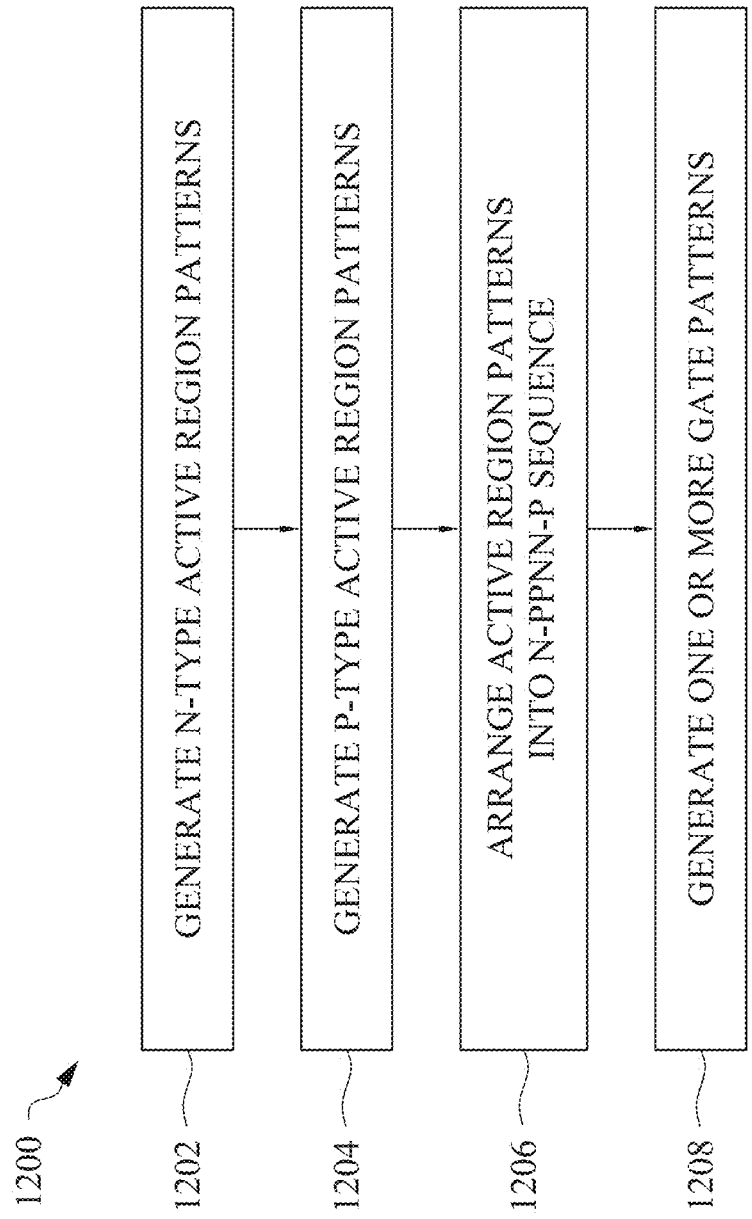
FIG. 12 is a flowchart of a method of generating a layout diagram of an IC, in accordance with some embodiments.

FIG. 12 is a flowchart of a method 1200 of generating a layout diagram, in accordance with some embodiments.

At a block 1202 of FIG. 12, N-type active region patterns are generated. The N-type active region patterns are arranged substantially parallel with respect to one another and extend in a first direction. In some embodiments, the first direction is the horizontal direction. Relative to a second direction (e.g., the vertical direction) perpendicular to the first direction, a first instance of the N-type active region patterns (first N-type AR pattern) has a height of 1γ and a second instance of the N-type active region patterns (second N-type AR pattern) has a height of 3γ, where (again) γ is a unit of measure dependent on the corresponding semiconductor process technology node. Examples of such N-type active region patterns include 314 and 324 in FIGS. 3A-3B, or the like. From block 1202, flow proceeds to block 1204.

At block 1204, the P-type active region patterns are arranged substantially parallel with respect to one another and extend in the first direction. Relative to the second direction, a first instance of the P-type active region patterns has a height of 1γ and a second instance of the P-type active region patterns has a height of 3γ. Examples of such P-type active region patterns include 318 and 322 in FIGS. 3A-3B, or the like. From block 1204, flow proceeds to block 1206.

At block 1206, relative to a second direction perpendicular to the first direction, the N-type active region patterns and P-type active region patterns are arranged into an N-PPNN-P sequence. For example, relative to the second direction, the first P-type AR pattern is on the bottom, the second N-type AR pattern is on the first P-type AR pattern, the second P-type AR pattern is on the second N-type AR pattern, and the first N-type AR pattern is on the second P-type AR pattern, where the sub-sequence PPNN is represented by the second P-type AR pattern is on the second N-type AR pattern. Alternatively, the example is represented below in Table 1 as a stack.

TABLE 1

| Sequence | Pattern | Example Element of FIGS. 3A-3B |
| --- | --- | --- |
| N | first N-type AR pattern | 214 |
| P | second P-type pattern | 222 |
| P |  |  |
| N | second N-type pattern | 224 |
| N |  |  |
| P | first P-type pattern | 218 |

From block 1206, flow proceeds to a block 1208.

At block 1208, gate patterns are generated. The gate patterns are arranged substantially parallel to each other and extend in the second direction. Examples of such gate patterns are instances of gate pattern 376A in FIG. 3C, or the like.

Figure 13:
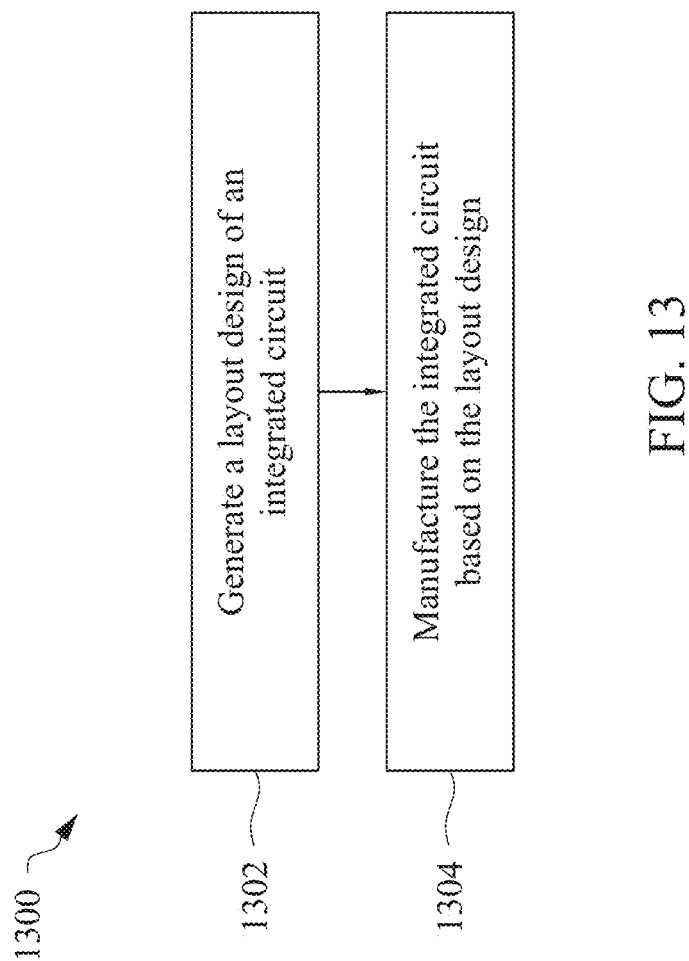
FIG. 13 is a flowchart of a method of manufacturing an IC, in accordance with some embodiments.

FIG. 13 is a flowchart of a method 1300 of manufacturing a semiconductor device, in accordance with some embodiments.

Method 1300 is implementable, for example, using EDA system 1500 (FIG. 15, discussed below) and an integrated circuit (IC) manufacturing system 1600 (FIG. 16, discussed below), in accordance with some embodiments. Examples of a semiconductor device which can be manufactured according to method 1300 include IC 200 of FIG. 2, semiconductor devices corresponding to various ones of the layout diagrams disclosed herein, or the like.

In FIG. 13, method 1300 includes blocks 1302-1304. At block 1302, a layout diagram is generated which, among other things, includes one or more of layout diagrams disclosed herein, e.g., a layout diagram resulting from method 1200 of FIG. 12, or the like. Block 1302 is implementable, for example, using EDA system 1500 (FIG. 15, discussed below), in accordance with some embodiments.

More particularly, block 1302 includes generating shapes corresponding to structures in a semiconductor diagram which are to be represented. For example, regarding at block 1302: where the layout diagram being generated corresponds to semiconductor cell region 212, block 1302 includes generating shapes corresponding to the structures shown in semiconductor cell region 212; where the layout diagram being generated corresponds to semiconductor cell region 220, block 1302 includes generating shapes corresponding to the structures shown in semiconductor cell region 220; where the layout diagram being generated corresponds to semiconductor cell region 216, block 1302 includes generating shapes corresponding to the structures shown in semiconductor cell region 216; where the layout diagram being generated corresponds to cell region 226, block 1302 includes generating shapes corresponding to the structures shown in cell region 226; where the layout diagram being generated corresponds to cell 312, block 1302 includes generating shapes corresponding to the structures shown in cell 312; where the layout diagram being generated corresponds to cell 320, block 1302 includes generating shapes corresponding to the structures shown in cell 320; or the like. From block 1302, flow proceeds to block 1304.

At block 1304, based on the layout diagram, at least one of (A) one or more photolithographic exposures are made or (B) one or more semiconductor masks are fabricated or (C) one or more components in a layer of a semiconductor device are fabricated. See discussion below of IC manufacturing system 1600 in FIG. 16 below.

Figure 14:
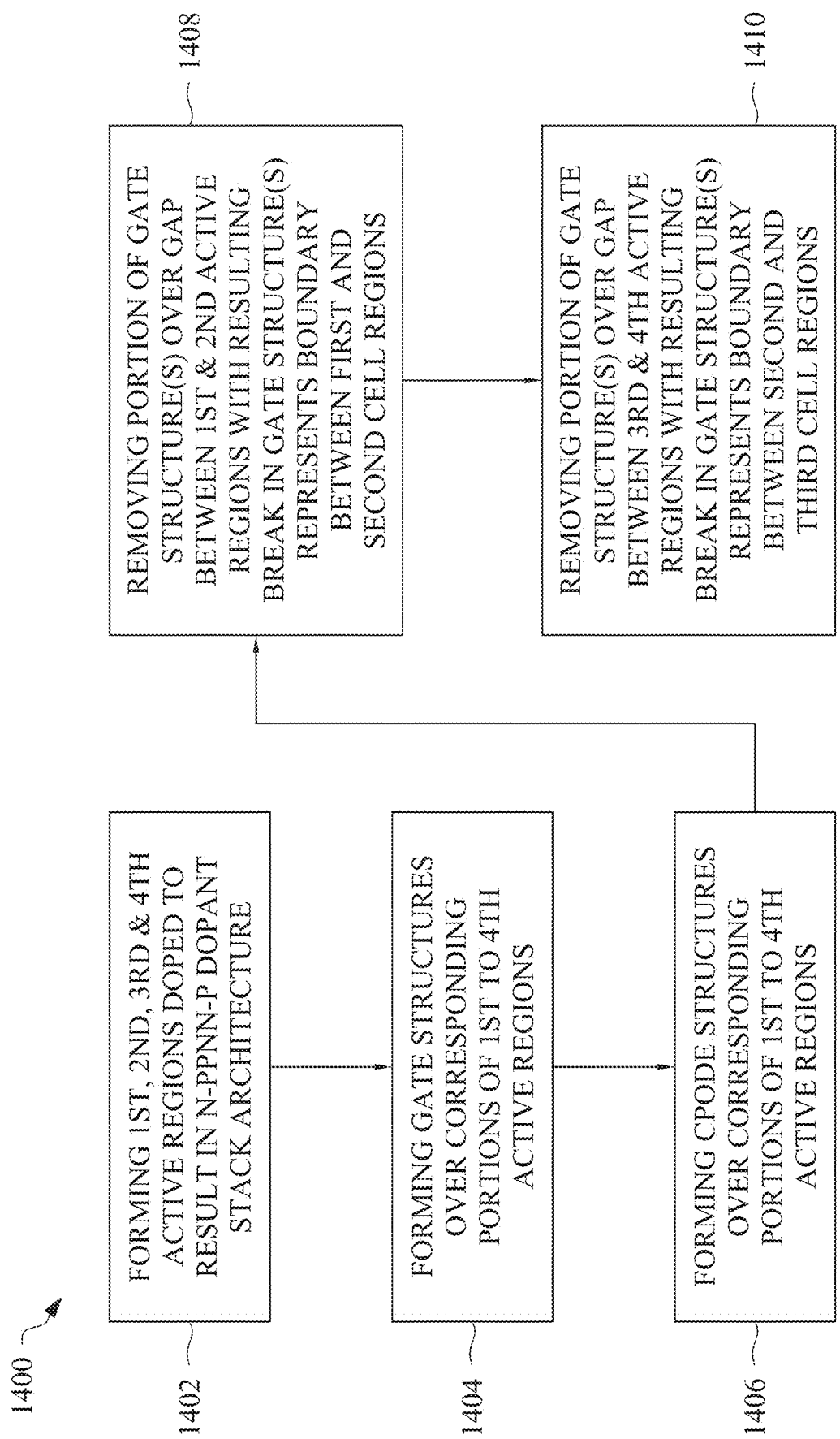
FIG. 14 is another flowchart of a method of manufacturing an IC, in accordance with some embodiments.

FIG. 14 is a flowchart of a method 1400 of manufacturing an IC, in accordance with some embodiments.

Method 1400 includes blocks 1402-1410. At block 1402, first, second, third and fourth active regions are formed resulting in an N-PPNN-P dopant-stack architecture. Examples of active region patterns in layout diagrams corresponding to first to fourth active regions arranged in an N-PPNN-P dopant-stack architecture include the active region patterns of FIGS. 2, 3A-3B, 5, 7, 9, 11, or the like.

In some embodiments, block 1402 includes the following. Extending the first to fourth active regions in a first direction (e.g., parallel to the X-axis). Relative to a second direction (e.g., parallel to the Y-axis) perpendicular to the first direction: arranging a sequence of the first to fourth active regions; sizing the first and fourth active regions to have a height of one unit; sizing the second and third active regions to have a height of three units; doping the first and third active regions to have N-type conductivity; and doping the second and fourth active regions to have P-type conductivity. An example of the unit of height is γ, discussed above. Relative to the second direction, the arranging a sequence of the first to fourth active regions results in a sequence as follows: the first active region→the second active region→the third active region→the fourth active region, and the sequence results in the IC having the dopant-stack architecture of N-PPNN-P. From block 1402, flow proceeds to block 1404.

At block 1404, gate structures are formed that extend in the second direction and overlap corresponding portions of the first, second, third and fourth active regions. Examples of gate patterns corresponding to the gate structures include gate patterns 376A-D of FIGS. 3A-3B, the gate patterns of 5, 7, 9, 11, or the like. From block 1404, flow proceeds to block 1406.

At block 1406, assuming that the gate structures are regarded as representing a group, and relative to the group of the gate structures, and further relative to the first direction, forming CPODE structures over corresponding portions of the first to fourth active regions on first and second sides of the group relative to the first direction. In some embodiments, relative to the X-axis, a first CPODE structure is formed at the left side of the group of gate structures which replaces the gate structure representing the left side of the group of gate structures, and a second CPODE structure is formed at the right side of the group of gate structures which replaces the gate structure representing the right side of the group of gate structures. In some embodiments, the first and second CPODE structures are formed concurrently. In some embodiments, the concurrent formation of the first and second CPODE structures includes multiple steps including: sacrificing/removing (e.g., etching) each of the gate structure representing the left side of the group of gate structures to form a first trench and the gate structure representing the right side of the group of gate structures to form a second trench; and then filling each of the first and second trenches with one or more dielectric materials to form corresponding first and second electrical isolation structures such that the physical dimensions of the resultant first and second electrical isolation structure are similar to the dimensions of the corresponding dummy gates which were sacrificed. In some embodiments, before the first and second trenches are filled, the first and second trenches are deepened by removing (e.g., etching) portions of a substrate under the first and second tranches. Examples of CPODE patterns corresponding to the CPODE structures include CPODE patterns 396A-B of FIGS. 3B, the CPODE patterns of FIGS. 5, 7, 9, 11, or the like.

In some embodiments, block 1406 more specifically includes forming first CPODE structure and forming a second CPODE structure. The forming a first CPODE structure locates the first CPODE structure to a first side of the group of gate structures, the first CPODE structure extending in the second direction and overlapping corresponding portions of the first, second, third and fourth active regions such that, relative to the first direction, the first CPODE structure represents boundaries correspondingly of the first, second and third cell regions. The forming a second CPODE structure locates the second CPODE structure to a second side of the group of gate structures, the second CPODE structure extending in the second direction and overlapping corresponding portions of the first, second, third and fourth active regions such that, relative to the first direction, the second CPODE structure represents boundaries correspondingly of the first, second and third cell regions. From block 1406, flow proceeds to block 1408.

At block 1408, relative to the second direction, a portion of at least one of the gate structures overlying a first gap between the first active region and the second active region is removed, a resulting break in the at least one of the gate structures representing a boundary between a first cell region that includes the first active region and a second cell region that includes the second and third active regions. Examples of cells in a layout diagram corresponding to the first cell region include cell 312 in FIGS. 3A-3B, cell 502A in FIG. 5, cell 702A in FIG. 7, cell 902A in FIG. 9, cell 1102A in FIG. 11, or the like. Examples of cells in a layout diagram corresponding to the second cell region include cell 320 in FIGS. 3A-3B, inverter cell 504 in FIG. 5, cell 704 in FIG. 7, cell 904 in FIG. 9, cell 1104 in FIG. 11, or the like. An example of a resulting break in the gate structures includes a break in a gate structure that would result in an IC based on layout diagrams 300A or 300B, and more particularly that would result from the portion of CPO pattern 374 that overlies gate pattern 376A in FIGS. 3A-3B at the boundary between cells 312 and 320. From block 1408, flow proceeds to block 1410.

At block 1410, relative to the second direction, a portion of at least one of the gate structures overlying a second gap between the third active region and the fourth active region is removed, a resulting break in the at least one of the gate structures representing a boundary between the second cell region and a third cell region that includes the fourth active region. Examples of the second cell region are provided above in the discussion of block 1408. Examples of cells in a layout diagram corresponding to the third cell region include cell 316 in FIGS. 3A-3B, cell 502B in FIG. 5, cell 702B in FIG. 7, cell 902B in FIG. 9, cell 1102B in FIG. 11, or the like. An example of a resulting break in the gate structures includes a break in a gate structure that would result in an IC based on layout diagrams 300A or 300B, and more particularly that would result from the portion of CPO pattern 374 that overlies gate pattern 376A in FIGS. 3A-3B at the boundary between cells 320 and 316.

FIG. 15 is a block diagram of an electronic design automation (EDA) system 1500 in accordance with some embodiments.

In some embodiments, EDA system 1500 includes an APR system. The method 1400 of flowchart of FIG. 14 is implemented, for example, using EDA system 1500, in accordance with some embodiments, in order to generate an instance of non-uniform-height, ½H n-type cell region 106 or p-type cell region 110, uniform-height 1.0H cell structure (FIG. 2), or non-uniform-height 2.0H PPNN-type cell region 108, or other suitable materials are within the contemplated scope of the disclosure.

In some embodiments, EDA system 1500 is a general purpose computing device including a hardware processor 1502 and a non-transitory, computer-readable storage medium 1504. Storage medium 1504, amongst other things, is encoded with, i.e., stores, computer program code 1506, i.e., a set of executable instructions. Execution of instructions 1506 by hardware processor 1502 represents (at least in part) an EDA tool which implements a portion or all of, e.g., the methods of FIGS. 12-14, in accordance with one or more embodiments (hereinafter, the noted processes and/or methods).

Processor 1502 is electrically coupled to computer-readable storage medium 1504 via a bus 1508. Processor 1502 is further electrically coupled to an I/O interface 1510 by bus 1508. A network interface 1512 is further electrically connected to processor 1502 via bus 1508. Network interface 1512 is connected to a network 1514, so that processor 1502 and computer-readable storage medium 1504 are capable of connecting to external elements via network 1514. Processor 1502 is configured to execute computer program code 1506 encoded in computer-readable storage medium 1504 in order to cause system 1500 to be usable for performing a portion or all of the noted processes and/or methods. In one or more embodiments, processor 1502 is a central processing unit (CPU), a multi-processor, a distributed processing system, an application specific integrated circuit (ASIC), and/or a suitable processing unit.

In one or more embodiments, computer-readable storage medium 1504 is an electronic, magnetic, optical, electromagnetic, infrared, and/or a semiconductor system (or apparatus or device). For example, computer-readable storage medium 1504 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 1504 includes a compact disk-read only memory (CD-ROM), a compact disk-read/write (CD-R/W), and/or a digital video disc (DVD).

In one or more embodiments, storage medium 1504 stores computer program code 1506 configured to cause system 1500 (where such execution represents (at least in part) the EDA tool) to be usable for performing a portion or all of the noted processes and/or methods. In one or more embodiments, storage medium 1504 further stores information which facilitates performing a portion or all of the noted processes and/or methods. In one or more embodiments, storage medium 1504 stores library 1507 of standard cells including such standard cells as disclosed herein.

EDA system 1500 includes I/O interface 1510. I/O interface 1510 is coupled to external circuitry. In one or more embodiments, I/O interface 1510 includes a keyboard, keypad, mouse, trackball, trackpad, touchscreen, and/or cursor direction keys for communicating information and commands to processor 1502.

EDA system 1500 further includes network interface 1512 coupled to processor 1502. Network interface 1512 allows system 1500 to communicate with network 1514, to which one or more other computer systems are connected. Network interface 1512 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 1500.

System 1500 is configured to receive information through I/O interface 1510. The information received through I/O interface 1510 includes one or more of instructions, data, design rules, libraries of standard cells, and/or other parameters for processing by processor 1502. The information is transferred to processor 1502 via bus 1508. EDA system 1500 is configured to receive information related to a UI through I/O interface 1510. The information is stored in computer-readable medium 1504 as a user interface (UI).

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 1500. In some embodiments, a layout which includes standard cells is generated using a tool such as VIR- TUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 16:
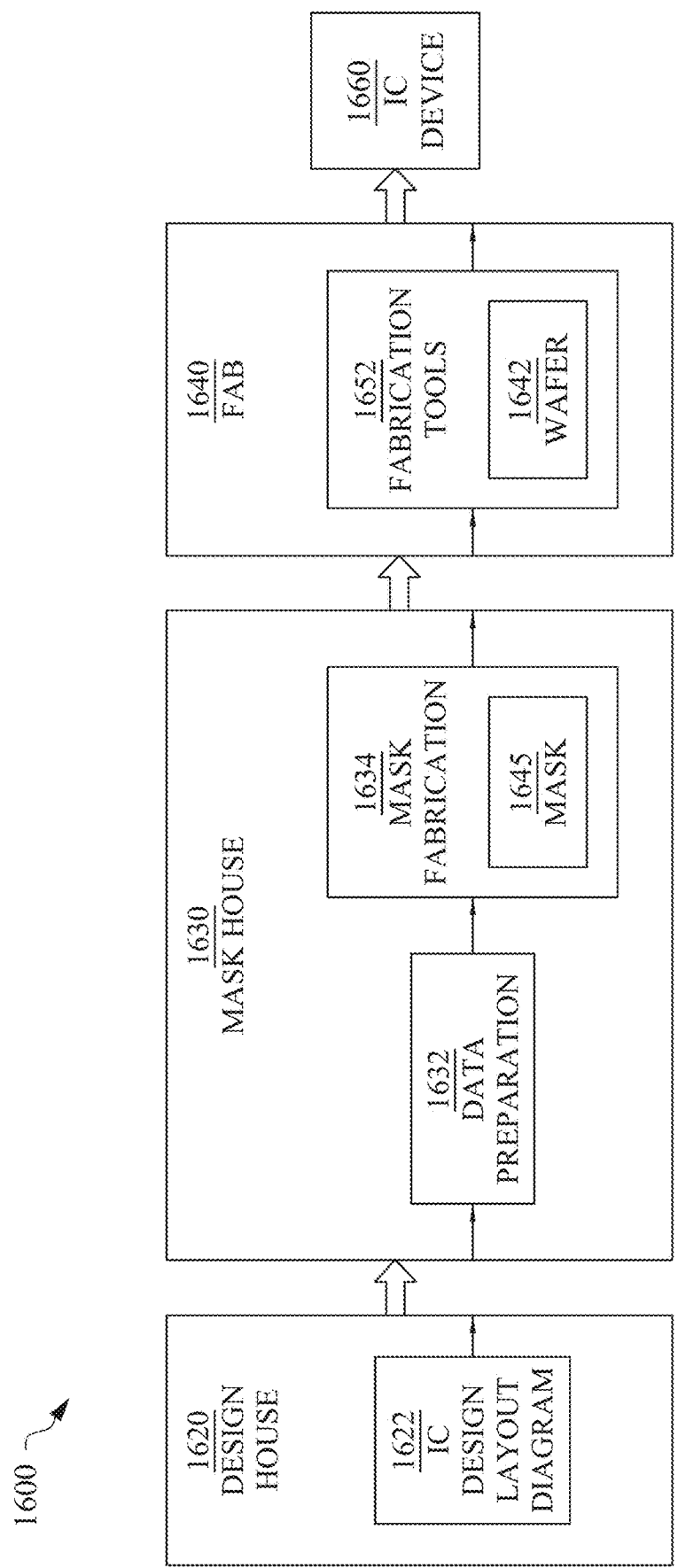
FIG. 16 is a block diagram of an integrated circuit (IC) manufacturing system, and an IC manufacturing flow associated therewith, in accordance with some embodiments.

FIG. 16 is a block diagram of an integrated circuit (IC) manufacturing system 1600, and an IC manufacturing flow associated therewith, in accordance with some embodiments.

After block 1302 of FIG. 13, based on the layout, at least one of (A) one or more semiconductor masks or (B) at least one component in a layer of an inchoate semiconductor integrated circuit is fabricated using manufacturing system 1600. In some embodiments, after block 1402 of FIG. 14, based on the layout, at least one of (A) one or more semiconductor masks or (B) at least one component in a layer of an inchoate semiconductor integrated circuit is fabricated In FIG. 16, IC manufacturing system 1600 includes entities, such as a design house 1620, a mask house 1630, and an IC manufacturer/fabricator ("fab") 1640, that interact with one another in the design, development, and manufacturing cycles and/or services related to manufacturing an IC device 1660. The entities in system 1600 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 1620, mask house 1630, and IC fab 1640 is owned by a single larger company. In some embodiments, two or more of design house 1620, mask house 1630, and IC fab 1640 coexist in a common facility and use common resources.

Design house (or design team) 1620 generates an IC design layout 1622. IC design layout 1622 includes various geometrical patterns designed for an IC device 1660. The geometrical patterns correspond to patterns of metal, oxide, or semiconductor layers that make up the various components of IC device 1660 to be fabricated. The various layers combine to form various IC features. For example, a portion of IC design layout 1622 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 1620 implements a proper design procedure to form IC design layout 1622. The design procedure includes one or more of logic design, physical design or place and route. IC design layout 1622 is presented in one or more data files having information of the geometrical patterns. For example, IC design layout 1622 is expressed in a GDSII file format or DFII file format.

Mask house 1630 includes data preparation 1632 and mask fabrication 1634. Mask house 1630 uses IC design layout 1622 to manufacture one or more masks to be used for fabricating the various layers of IC device 1660 according to IC design layout 1622. Mask house 1630 performs mask data preparation 1632, where IC design layout 1622 is translated into a representative data file ("RDF"). Mask data preparation 1632 supplies the RDF to mask fabrication 1634. Mask fabrication 1634 includes a mask writer. A mask writer converts the RDF to an image on a substrate, such as a mask (reticle) or a semiconductor wafer. The design layout is manipulated by mask data preparation 1632 to comply with particular characteristics of the mask writer and/or requirements of IC fab 1640. In FIG. 16, mask data preparation 1632, mask fabrication 1634, and mask 1645 are illustrated as separate elements. In some embodiments, mask data preparation 1632 and mask fabrication 1634 are collectively referred to as mask data preparation.

In some embodiments, mask data preparation 1632 includes optical proximity correction (OPC) which uses lithography enhancement techniques to compensate for image errors, such as those that can arise from diffraction, interference, other process effects and the like. OPC adjusts IC design layout 1622. In some embodiments, mask data preparation 1632 includes further resolution enhancement techniques (RET), such as off-axis illumination, sub-resolution assist features, phase-shifting masks, other suitable techniques, and the like or combinations thereof. In some embodiments, inverse lithography technology (ILT) is further used, which treats OPC as an inverse imaging problem.

In some embodiments, mask data preparation 1632 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 1634, which may undo part of the modifications performed by OPC in order to meet mask creation rules.

In some embodiments, mask data preparation 1632 includes lithography process checking (LPC) that simulates processing that will be implemented by IC fab 1640 to fabricate IC device 1660. LPC simulates this processing based on IC design layout 1622 to create a simulated manufactured device, such as IC device 1660. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been created by LPC, if the simulated device is not close enough in shape to satisfy design rules, OPC and/or MRC are be repeated to further refine IC design layout 1622.

It is understood that the above description of mask data preparation 1632 has been simplified for the purposes of clarity. In some embodiments, data preparation 1632 includes additional features such as a logic operation (LOP) to modify the IC design layout according to manufacturing rules. Additionally, the processes applied to IC design layout 1622 during data preparation 1632 may be executed in a variety of different orders.

After mask data preparation 1632 and during mask fabrication 1634, a mask 1645 or a group of masks are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 1634 is used in a variety of processes. For example, such a mask(s) is used in an ion implantation process to form various doped regions in the semiconductor wafer, in an etching process to form various etching regions in the semiconductor wafer, and/or in other suitable processes.

IC fab 1640 is an IC fabrication business that includes one or more manufacturing facilities for the fabrication of a variety of different IC products. In some embodiments, IC Fab 1640 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 1640 uses the mask 1645 (or masks) fabricated by mask house 1630 to fabricate IC device 1660. Thus, IC fab 1640 at least indirectly uses IC design layout 1622 to fabricate IC device 1660. In some embodiments, a semiconductor wafer 1642 is fabricated by fabrication tools 1642 using the mask 1645 (or masks) to form IC device 1660. Semiconductor wafer 1642 includes a silicon substrate or other proper substrate having material layers formed thereon. Semiconductor wafer further includes one or more of various doped regions, dielectric features, multilevel interconnects, and the like (formed at subsequent manufacturing steps).

Details regarding an integrated circuit (IC) manufacturing system (e.g., system 1600 of FIG. 13), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a method (of manufacturing an integrated circuit (IC) includes: forming active regions including first, second, third and fourth active regions that extend in a first direction, the forming active regions including, relative to a second direction perpendicular to the first direction, doping the first and third active regions to have N-type conductivity and resultantly a height of one unit, and doping the second and fourth active regions to have P-type conductivity and resultantly a height of 3 units; forming gate structures extending in the second direction and overlapping corresponding portions of the first, second, third and fourth active regions; relative to the second direction, removing a portion of at least one of the gate structures overlying a first gap between the first active region and the second active region, a resulting break in the at least one of the gate structures representing a boundary between a first cell region that includes the first active region and a second cell region that includes the second and third active regions; and, relative to the second direction, removing a portion of at least one of the gate structures overlying a second gap between the third active region and the fourth active region, a resulting break in the at least one of the gate structures representing a boundary between the second cell region and a third cell region that includes the fourth active region.

In some embodiments, relative to the second direction, the forming first, second, third and fourth active regions results in a sequence as follows: the first active region→the second active region→the third active region→the fourth active region; and the sequence results in the IC having a dopant-stack architecture of N-PPNN-P. In some embodiments, the gate structures represent a group and, relative to the group of the gate structures, and further relative to the first direction, the method further comprises: forming a first CPODE structure to a first side of the group of gate structures, the first CPODE structure extending in the second direction and overlapping corresponding portions of the first, second, third and fourth active regions such that, relative to the first direction, the first CPODE structure represents boundaries correspondingly of the first, second and third cell regions; and forming a second CPODE structure to a second side of the group of gate structures, the second CPODE structure extending in the second direction and overlapping corresponding portions of the first, second, third and fourth active regions such that, relative to the first direction, the second CPODE structure represents boundaries correspondingly of the first, second and third cell regions. In some embodiments, the forming gate structures includes, relative to the first direction, spacing the gate structures apart from each other by one unit of pitch (pitch-unit), where the pitch-unit is a unit of measure dependent on a corresponding semiconductor process technology node; the forming a first CPODE structure includes, relative to the first direction, spacing the first CPODE structure from a nearest one the gates structures by one pitch-unit; the forming a second CPODE structure includes, relative to the first direction, spacing the second CPODE structure from a nearest one the gates structures by one pitch-unit; and the forming gate structures further includes: for a circumstance in which the IC is a buffer circuit or an AND gate, setting a number of the gate structures being formed so that, relative to the first direction, a total pitch of each of the first, second and third cell regions is four pitch units; or for a circumstance in which the IC is an AND-OR-INVERT (AOI) gate, setting a number of the gate structures being formed so that, relative to the first direction, a total pitch of each of the first, second and third cell regions is five pitch units; or for a circumstance in which the IC is a scan D flip-flop (SDFF), setting a number of the gate structures being formed so that, relative to the first direction, a total pitch of each of the first, second and third cell regions is fifteen pitch units.

An aspect of this description relates to a method of manufacturing an integrated circuit (IC). The method includes forming a first active region in a first cell. The method further includes forming a plurality of second active regions in a second cell, wherein the second cell abuts the first cell. The method further includes forming a third active region in a third cell, wherein the third cell abuts the second cell, the second cell is between the first cell and the third cell, and a height of the second cell is different from a height of the first cell or the third cell. The method further includes forming a plurality of gate structures extending across each of the first active region, the plurality of second active regions, and the third active region. The method further includes removing a first portion of a first gate structure of the plurality of gate structures at an interface between the first cell and the second cell, wherein the first portion of the first gate structure is between the first active region and the plurality of second active regions. In some embodiments, the method further includes removing a second portion of the first gate structure at an interface between the second cell and the third cell, wherein the second portion of the first gate structure is between the third active region and the plurality of second active regions. In some embodiments, the method further includes maintaining a second gate structure of the plurality of gate structures across the first active region, the plurality of second active regions, and the third active region during the manufacturing of the IC. In some embodiments, the method further includes forming a first via electrically connected to the first gate structure at a first location over the first active region; forming a second via electrically connected to the first gate structure at a second location over at least one second active region of the plurality of second active regions; and forming a third via electrically connected to the first gate structure at a third location over the third active region. In some embodiments, the method further includes forming a fourth via over a second gate structure of the plurality of gate structures at a fourth location over the at least one second active region, wherein IC is free of vias electrically connected to the second gate structure at locations over the first active area and the third active area. In some embodiments, the method further includes forming a fourth via over a second gate structure of the plurality of gate structures at a fourth location over the first active region; and forming a fifth via over the second gate structure at a fifth location over the third active region, wherein IC is free of vias electrically connected to the second gate structure at locations over the plurality of second active regions. In some embodiments, the method further includes forming a fourth via over a second gate structure of the plurality of gate structures at a fourth location between adjacent second active regions of the plurality of second active regions, wherein IC is free of vias electrically connected to the second gate structure at locations over the first active area and the third active area. In some embodiments, the method further includes forming a plurality of continuous poly on oxide definition edge (CPODE) patterns over the first active region, the plurality of second active regions, and the third active region, wherein the plurality of gate structures is between adjacent CPODE patterns. In some embodiments, the method further includes removing a first portion of a first CPODE pattern of the plurality of CPODE patterns at the interface of the first cell and the second cell. In some embodiments, removing the first portion of the first CPODE pattern includes removing the first portion of the CPODE pattern simultaneously with removing the first portion of the first gate structure. In some embodiments, the method further includes removing a first portion of a second CPODE pattern of the plurality of CPODE patterns at the interface of the first cell and the second cell. In some embodiments, the method further includes forming a conductive line parallel to the plurality of gate structures above the plurality of gate structures, wherein the conductive line is between adjacent gate structure of the plurality of gate structures in a plan view.

An aspect of this description relates to a method of manufacturing an integrated circuit (IC). The method includes forming a first active region in a first cell. The method further includes forming a plurality of second active regions in a second cell, wherein the second cell abuts the first cell. The method further includes forming a third active region in a third cell, wherein the third cell abuts the second cell, the second cell is between the first cell and the third cell, and a dimension of each of the plurality of second active regions is different from a dimension of each of the first active region and the third active region. The method further includes forming a plurality of gate structures extending across each of the first active region, the plurality of second active regions, and the third active region. The method further includes forming a plurality of continuous poly on oxide definition edge (CPODE) patterns over the first active region, the plurality of second active regions, and the third active region, wherein the plurality of gate structures is between adjacent CPODE patterns of the plurality of CPODE patterns. The method further includes removing a first portion of a first gate structure of the plurality of gate structures at an interface between the first cell and the second cell. The method further includes removing a first portion of a first CPODE pattern of the plurality of CPODE patterns at the interface between the first cell and the second cell. In some embodiments, the method further includes removing a second portion of the first gate structure at an interface between the third cell and the second cell; and removing a second portion of the first CPODE pattern at the interface between the third cell and the second cell. In some embodiments, the method further includes removing a first portion of a second CPODE pattern of the plurality of CPODE patterns at the interface between the first cell and the second cell, wherein the first portion of the second CPODE pattern is aligned with the first portion of the first CPODE pattern. In some embodiments, removing the first portion of the first gate structure includes removing the first portion of the first gate structure simultaneously with removing the first portion of the CPODE pattern.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A method of manufacturing an integrated circuit (IC), the method comprising:
   forming active regions including first, second, third and fourth active regions that extend in a first direction, the forming active regions including:
   relative to a second direction perpendicular to the first direction:
   doping the first and third active regions to have N-type conductivity and resultantly a height of one unit; and
   doping the second and fourth active regions to have P-type conductivity and resultantly a height of three units;
   forming gate structures extending in the second direction and overlapping corresponding portions of the first, second, third and fourth active regions;
   relative to the second direction:

removing a portion of at least one of the gate structures overlying a first gap between the first active region and the second active region, a resulting break in the at least one of the gate structures representing a boundary between a first cell region that includes the first active region and a second cell region that includes the second and third active regions; and removing a portion of at least one of the gate structures overlying a second gap between the third active region and the fourth active region, a resulting break in the at least one of the gate structures representing a boundary between the second cell region and a third cell region that includes the fourth active region.

2. The method of claim 1, wherein:

relative to the second direction, the forming first, second, third and fourth active regions results in a sequence as follows:

the first active region→the second active region→the third active region→the fourth active region; and the sequence results in the IC having a dopant-stack architecture of N-PPNN-P.

3. The method of claim 1, wherein:

the gate structures represent a group; and relative to the group of the gate structures, and further relative to the first direction, the method further comprises:

forming a first CPODE structure to a first side of the group of gate structures, the first CPODE structure extending in the second direction and overlapping corresponding portions of the first, second, third and fourth active regions such that, relative to the first direction, the first CPODE structure represents boundaries correspondingly of the first, second and third cell regions; and forming a second CPODE structure to a second side of the group of gate structures, the second CPODE structure extending in the second direction and overlapping corresponding portions of the first, second, third and fourth active regions such that, relative to the first direction, the second CPODE structure represents boundaries correspondingly of the first, second and third cell regions.

4. The method of claim 3, wherein:

the forming gate structures includes:

relative to the first direction, spacing the gate structures apart from each other by one unit of pitch (pitch-unit), where the pitch-unit is a unit of measure dependent on a corresponding semiconductor process technology node;

the forming a first CPODE structure includes:

relative to the first direction, spacing the first CPODE structure from a nearest one the gates structures by one pitch-unit;

the forming a second CPODE structure includes:

relative to the first direction, spacing the second CPODE structure from a nearest one the gates structures by one pitch-unit; and the forming gate structures further includes:

for a circumstance in which the IC is a buffer circuit or an AND gate, setting a number of the gate structures being formed so that, relative to the first direction, a total pitch of each of the first, second and third cell regions is four pitch units; or for a circumstance in which the IC is an AND-OR-INVERT (AOI) gate, setting a number of the gate structures being formed so that, relative to the first direction, a total pitch of each of the first, second and third cell regions is five pitch units; or for a circumstance in which the IC is a scan D flip-flop (SDFF), setting a number of the gate structures being formed so that, relative to the first direction, a total pitch of each of the first, second and third cell regions is fifteen pitch units.

5. A method of manufacturing an integrated circuit (IC), the method comprising:

forming a first active region in a first cell;

forming a plurality of second active regions in a second cell, wherein the second cell abuts the first cell;

forming a third active region in a third cell, wherein the third cell abuts the second cell, the second cell is between the first cell and the third cell, and a height of the second cell is different from a height of the first cell or the third cell;

forming a plurality of gate structures extending across each of the first active region, the plurality of second active regions, and the third active region; and removing a first portion of a first gate structure of the plurality of gate structures at an interface between the first cell and the second cell, wherein the first portion of the first gate structure is between the first active region and the plurality of second active regions.

6. The method of claim 5, further comprising removing a second portion of the first gate structure at an interface between the second cell and the third cell, wherein the second portion of the first gate structure is between the third active region and the plurality of second active regions.

7. The method of claim 5, further comprising maintaining a second gate structure of the plurality of gate structures across the first active region, the plurality of second active regions, and the third active region during the manufacturing of the IC.

8. The method of claim 5, further comprising:

forming a first via electrically connected to the first gate structure at a first location over the first active region;

forming a second via electrically connected to the first gate structure at a second location over at least one second active region of the plurality of second active regions; and forming a third via electrically connected to the first gate structure at a third location over the third active region.

9. The method of claim 8, further comprising forming a fourth via over a second gate structure of the plurality of gate structures at a fourth location over the at least one second active region, wherein IC is free of vias electrically connected to the second gate structure at locations over the first active area and the third active area.

10. The method of claim 8, further comprising:

forming a fourth via over a second gate structure of the plurality of gate structures at a fourth location over the first active region; and forming a fifth via over the second gate structure at a fifth location over the third active region, wherein IC is free of vias electrically connected to the second gate structure at locations over the plurality of second active regions.

11. The method of claim 8, further comprising forming a fourth via over a second gate structure of the plurality of gate structures at a fourth location between adjacent second active regions of the plurality of second active regions, wherein IC is free of vias electrically connected to the second gate structure at locations over the first active area and the third active area.

12. The method of claim 5, further comprising forming a plurality of continuous poly on oxide definition edge (CPODE) patterns over the first active region, the plurality of second active regions, and the third active region, wherein the plurality of gate structures is between adjacent CPODE patterns.

13. The method of claim 12, further comprising removing a first portion of a first CPODE pattern of the plurality of CPODE patterns at the interface of the first cell and the second cell.

14. The method of claim 13, wherein removing the first portion of the first CPODE pattern comprises removing the first portion of the CPODE pattern simultaneously with removing the first portion of the first gate structure.

15. The method of claim 12, further comprising removing a first portion of a second CPODE pattern of the plurality of CPODE patterns at the interface of the first cell and the second cell.

16. The method of claim 5, further comprising forming a conductive line parallel to the plurality of gate structures above the plurality of gate structures, wherein the conductive line is between adjacent gate structure of the plurality of gate structures in a plan view.

17. A method of manufacturing an integrated circuit (IC), the method comprising:
   forming a first active region in a first cell;
   forming a plurality of second active regions in a second cell, wherein the second cell abuts the first cell;
   forming a third active region in a third cell, wherein the third cell abuts the second cell, the second cell is between the first cell and the third cell, and a dimension of each of the plurality of second active regions is different from a dimension of each of the first active region and the third active region;
   forming a plurality of gate structures extending across each of the first active region, the plurality of second active regions, and the third active region;
   forming a plurality of continuous poly on oxide definition edge (CPODE) patterns over the first active region, the plurality of second active regions, and the third active region, wherein the plurality of gate structures is between adjacent CPODE patterns of the plurality of CPODE patterns;
   removing a first portion of a first gate structure of the plurality of gate structures at an interface between the first cell and the second cell; and
   removing a first portion of a first CPODE pattern of the plurality of CPODE patterns at the interface between the first cell and the second cell.

18. The method of claim 17, further comprising:
   removing a second portion of the first gate structure at an interface between the third cell and the second cell; and
   removing a second portion of the first CPODE pattern at the interface between the third cell and the second cell.

19. The method of claim 17, further comprising removing a first portion of a second CPODE pattern of the plurality of CPODE patterns at the interface between the first cell and the second cell, wherein the first portion of the second CPODE pattern is aligned with the first portion of the first CPODE pattern.

20. The method of claim 17, wherein removing the first portion of the first gate structure comprises removing the first portion of the first gate structure simultaneously with removing the first portion of the CPODE pattern.

* * * * *